United States Patent
Rouleau et al.

(10) Patent No.: US 10,629,335 B2
(45) Date of Patent: Apr. 21, 2020

(54) WIRE HARNESS ASSEMBLY SYSTEM

(71) Applicant: Panduit Corp., Tinley Park, IL (US)

(72) Inventors: Rodney G. Rouleau, Manhattan, IL (US); Janina B. Nebes, Tinley Park, IL (US); Robert W. Kossak, Lemont, IL (US)

(73) Assignee: Panduit Corp., Tinley Park, IL (US)

( * ) Notice: Subject to any disclaimer, the term of this patent is extended or adjusted under 35 U.S.C. 154(b) by 504 days.

(21) Appl. No.: 14/884,358

(22) Filed: Oct. 15, 2015

(65) Prior Publication Data

US 2016/0125978 A1    May 5, 2016

Related U.S. Application Data

(60) Provisional application No. 62/158,880, filed on May 8, 2015, provisional application No. 62/073,665, filed on Oct. 31, 2014.

(51) Int. Cl.
*F16B 21/02* (2006.01)
*H02G 3/32* (2006.01)
(Continued)

(52) U.S. Cl.
CPC ... *H01B 13/01209* (2013.01); *B60R 16/0215* (2013.01); *F16B 21/02* (2013.01);
(Continued)

(58) Field of Classification Search
CPC ........ H01R 43/20; H01R 43/28; H05K 13/06; H02G 3/32; F16B 21/02; F16B 21/086;
(Continued)

(56) References Cited

U.S. PATENT DOCUMENTS 2,809,361 A  10/1957  Woofter et al.
3,087,984 A   4/1963  Waranch
(Continued)

FOREIGN PATENT DOCUMENTS

CN   102780026 A   1/2013
DE      109478     11/1974
(Continued)

OTHER PUBLICATIONS

Panduit Wire Harness Assembly; Jan. 4, 2017.*
ProjectionWorks Wire Harness Assembly; May 11, 2017.*
Whitney Blake Co. Wire Harness Assembly; Sep. 14, 2016.*

*Primary Examiner* — Monica S Carter
*Assistant Examiner* — Mahdi H Nejad
(74) *Attorney, Agent, or Firm* — Christopher S. Clancy; James H. Williams; Aimee E. McVady

(57) ABSTRACT

A wire harness assembly system is disclosed. The wire harness assembly system includes a locking mount for receiving a wire routing accessory. The locking mount includes a main body with an upper portion, a base flange, and a lower portion. The lower portion includes a locating shaft extending from the base flange. The locating shaft has keyed members positioned opposite each other. The locating shaft and the keyed members of the locking mount are positioned in keyed holes in a grid tile. The locking mount is rotated to a locked position in the grid tile to secure the locking mount and the wire routing accessory mounted thereto.

5 Claims, 30 Drawing Sheets

(51) Int. Cl.
  *H01B 13/012* (2006.01)
  *H05K 13/06* (2006.01)
  *B60R 16/02* (2006.01)
  *H01R 43/20* (2006.01)
(52) U.S. Cl.
  CPC ....... *H01B 13/01227* (2013.01); *H01R 43/20* (2013.01); *H02G 3/32* (2013.01); *H05K 13/06* (2013.01)
(58) Field of Classification Search
  CPC . B60R 16/0215; F16L 3/13; H01B 13/01209; H01B 13/012; H01B 13/01227; Y10T 403/7033; Y10T 403/7075
  USPC ........ 248/73; 174/72 A; 269/903; 403/359.5, 403/376
  See application file for complete search history.

(56) References Cited

U.S. PATENT DOCUMENTS

| | | | |
|---|---|---|---|
| 3,101,939 A | 8/1963 | Richter | |
| 3,169,305 A | 2/1965 | Gray | |
| 3,188,078 A * | 6/1965 | Peterson | B21D 43/003 269/305 |
| 3,258,039 A | 6/1966 | Ewalt | |
| 3,563,582 A | 2/1971 | Shroyer et al. | |
| 3,633,096 A | 1/1972 | Bollman | |
| 3,653,411 A * | 4/1972 | Mosher | H01B 13/01227 140/92.1 |
| 3,681,835 A | 8/1972 | Evans et al. | |
| 3,752,198 A | 8/1973 | Fiorentino et al. | |
| 3,946,768 A | 3/1976 | Fiorentino | |
| 4,009,852 A | 3/1977 | Bulanda et al. | |
| 4,029,277 A | 6/1977 | Bulanda | |
| 4,030,029 A | 6/1977 | Cox | |
| 4,051,383 A | 9/1977 | Dola | |
| 4,183,091 A | 1/1980 | Murai | |
| 4,218,745 A | 8/1980 | Perkins | |
| 4,323,227 A | 4/1982 | Turek | |
| 4,337,934 A * | 7/1982 | Caveney | B65B 13/18 248/68.1 |
| 4,566,235 A | 1/1986 | Groll | |
| 4,757,606 A | 7/1988 | Eaton | |
| 4,781,227 A | 11/1988 | Cross | |
| 4,867,207 A | 9/1989 | Crawford | |
| 4,979,544 A | 12/1990 | Swindlehurst | |
| 5,109,597 A | 5/1992 | Elder et al. | |
| 5,168,904 A * | 12/1992 | Quinkert | H01B 13/01209 140/92.1 |
| 5,215,297 A | 6/1993 | Sato et al. | |
| 5,438,506 A | 8/1995 | Oho et al. | |
| 5,478,060 A | 12/1995 | Sugimoto et al. | |
| 5,490,664 A * | 2/1996 | Justus | H01B 13/01209 269/296 |
| 5,522,436 A | 6/1996 | Tabuchi et al. | |
| 5,535,788 A | 7/1996 | Mori et al. | |
| 5,694,678 A | 12/1997 | Karasik | |
| 5,915,424 A | 6/1999 | Franks et al. | |
| 6,003,852 A * | 12/1999 | Kawamura | H01B 13/01209 269/287 |
| 6,125,532 A | 10/2000 | Takada | |
| 6,209,827 B1 * | 4/2001 | Kawai | F16B 21/02 248/49 |
| 6,308,944 B1 | 10/2001 | Ota et al. | |
| 6,715,513 B2 | 4/2004 | Landolt et al. | |
| 7,182,299 B2 * | 2/2007 | Takeuchi | F16B 5/0685 24/16 PB |
| 7,278,614 B2 | 10/2007 | Caveney et al. | |
| 7,334,610 B2 | 2/2008 | Levin et al. | |
| 7,527,226 B2 | 5/2009 | Kusuda et al. | |
| 7,594,583 B2 * | 9/2009 | Whipple | B60K 15/04 220/86.2 |
| 7,686,259 B2 * | 3/2010 | Caveney | B60R 16/0215 211/85.5 |
| 8,020,783 B2 | 9/2011 | Backman, Jr. | |
| 8,066,383 B2 | 11/2011 | Lin | |
| 8,069,556 B2 | 12/2011 | Selbach | |
| 8,225,498 B2 | 7/2012 | Lin | |
| 8,472,169 B2 | 6/2013 | Sun | |
| 8,704,623 B2 | 4/2014 | Dumonski | |
| 9,193,063 B2 * | 11/2015 | Huang | B25H 3/04 |
| 9,548,597 B2 * | 1/2017 | Vacca | H04Q 1/06 |
| 9,562,626 B2 * | 2/2017 | Gustin | B64D 47/00 |
| 10,256,011 B2 | 4/2019 | Rouleau et al. | |
| 2002/0031391 A1 * | 3/2002 | Jito | B05C 5/0241 401/11 |
| 2003/0213876 A1 * | 11/2003 | Takeuchi | F16B 21/02 248/71 |
| 2006/0175473 A1 | 8/2006 | Takeuchi | |
| 2009/0078835 A1 * | 3/2009 | Newhouse | F16L 3/1218 248/74.1 |
| 2010/0218369 A1 | 9/2010 | Selbach | |
| 2011/0113598 A1 * | 5/2011 | Hofmann | B60R 13/0206 24/458 |
| 2011/0268413 A1 * | 11/2011 | Cote | G02B 6/4471 385/135 |
| 2011/0302765 A1 * | 12/2011 | Marx | B60R 13/0206 29/525.01 |
| 2013/0047413 A1 * | 2/2013 | Burton | F16B 21/02 29/525.11 |
| 2013/0202349 A1 * | 8/2013 | Coffin | F16D 1/033 403/292 |
| 2014/0255087 A1 * | 9/2014 | Massengill | F16B 1/00 403/217 |
| 2015/0024615 A1 * | 1/2015 | Lindblom | H01R 13/625 439/121 |
| 2016/0118724 A1 * | 4/2016 | Wootton | G01R 15/18 324/127 |
| 2016/0125978 A1 | 5/2016 | Rouleau et al. | |
| 2016/0126687 A1 | 5/2016 | Rouleau et al. | |
| 2019/0032696 A1 * | 1/2019 | Sbongk | B60R 13/0206 |
| 2019/0136894 A1 * | 5/2019 | Leidig | F16B 21/086 |

FOREIGN PATENT DOCUMENTS

| | | | |
|---|---|---|---|
| GB | 2295497 A * | 5/1996 | |
| GB | 2295497 A | 5/1996 | |
| JP | S5337088 U | 4/1978 | |
| JP | S5659715 U | 5/1981 | |
| JP | 62136015 U | 8/1987 | |
| JP | S62136015 U | 8/1987 | |
| JP | H0568028 U | 9/1993 | |
| JP | H06-018706 U | 3/1994 | |
| JP | 09045156 A | 2/1997 | |
| JP | 2001150265 A | 6/2001 | |

* cited by examiner

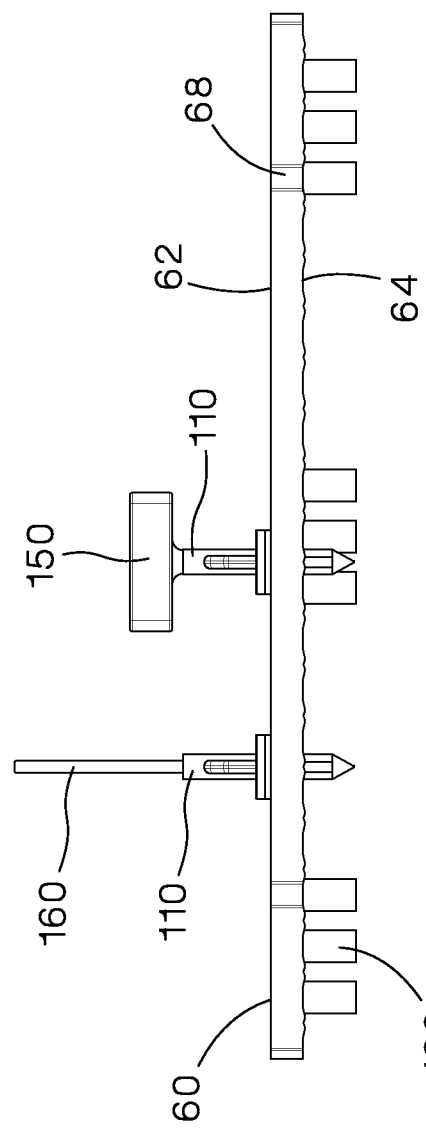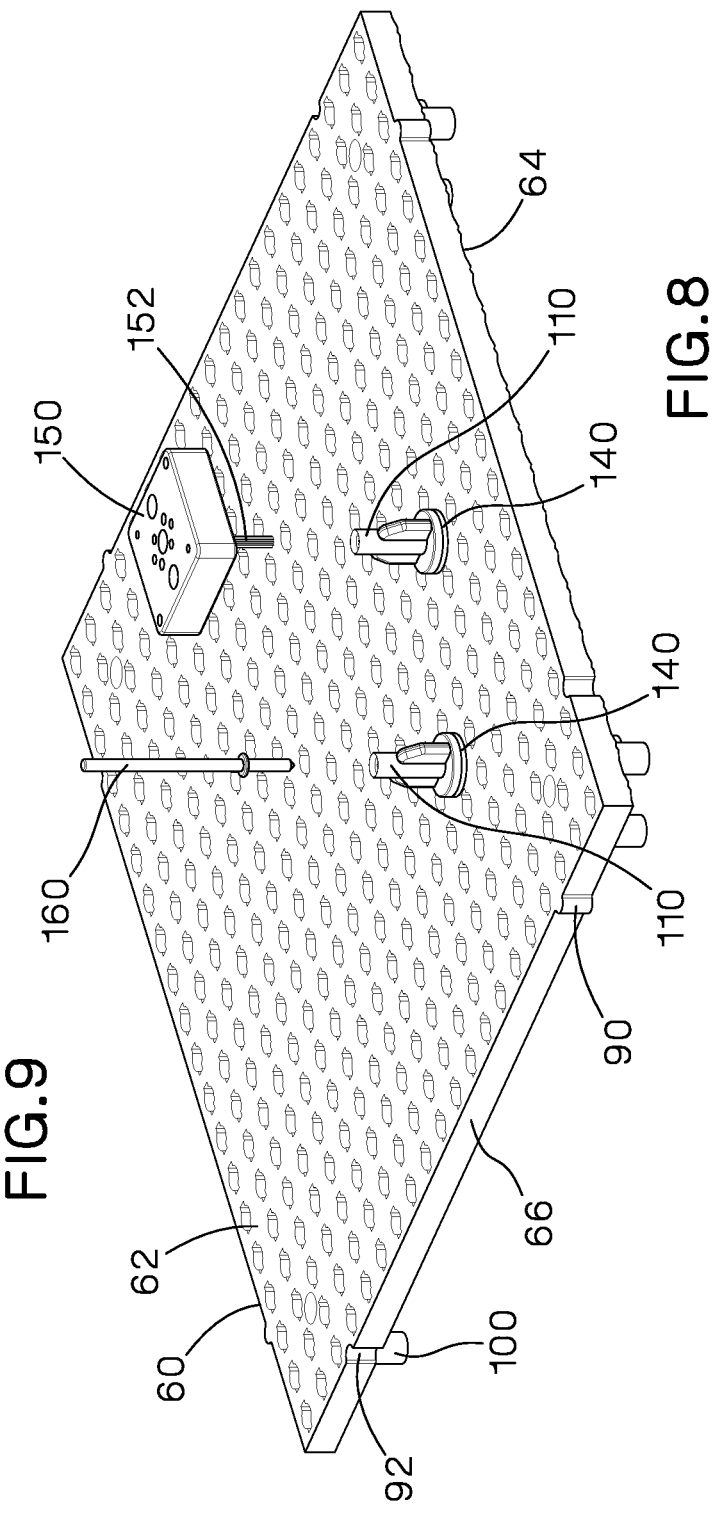

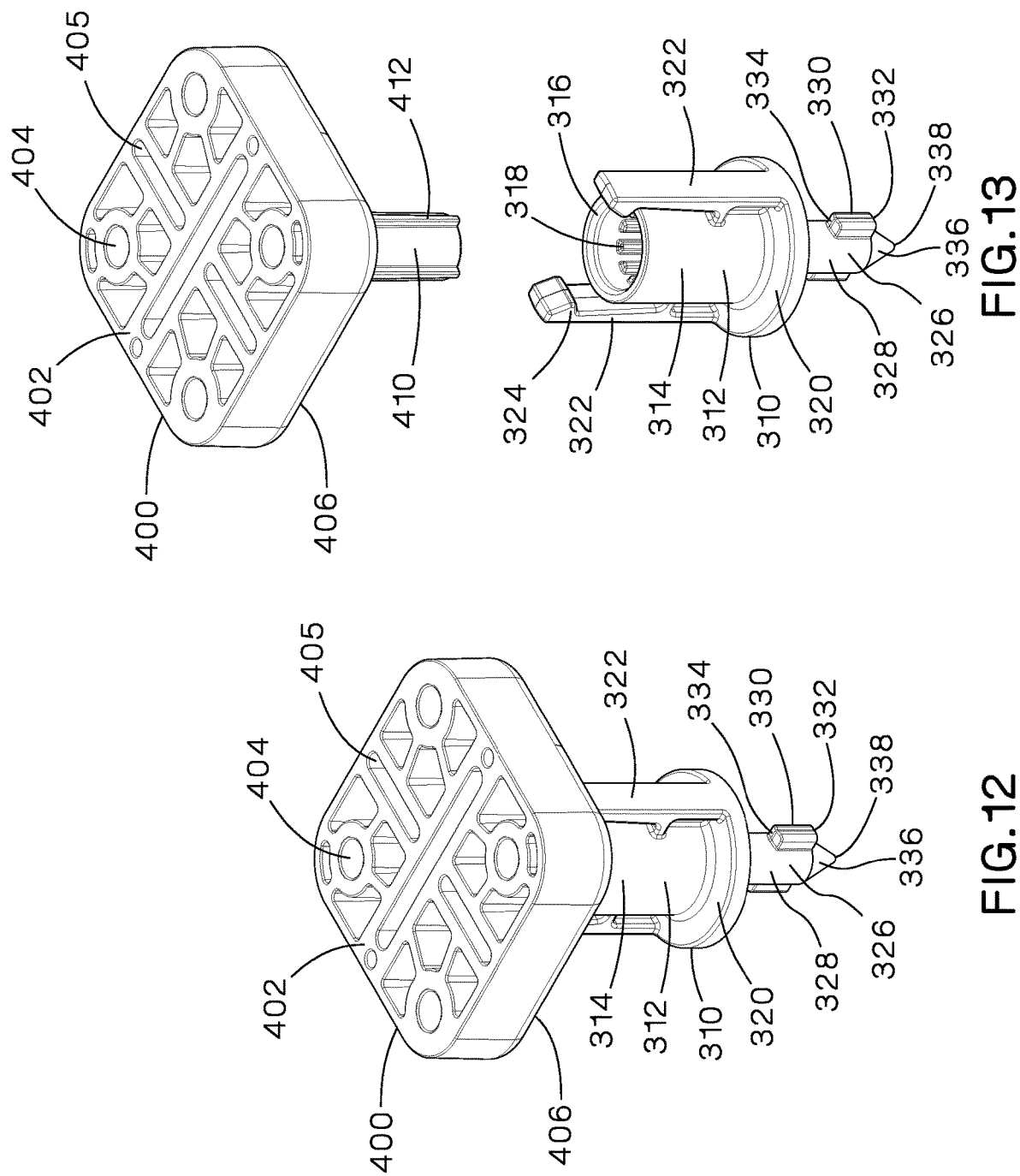

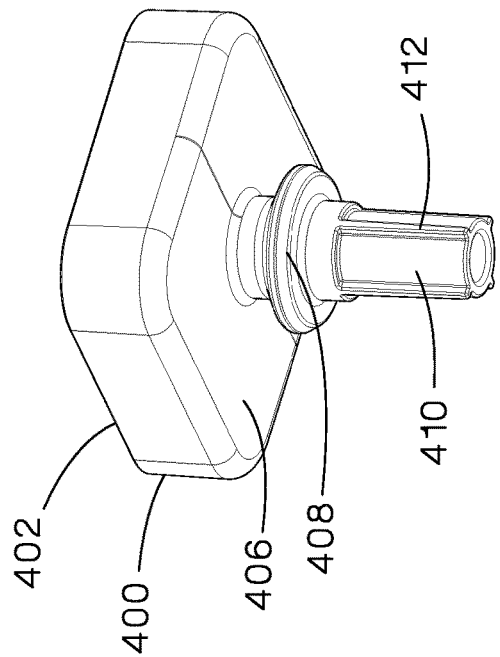
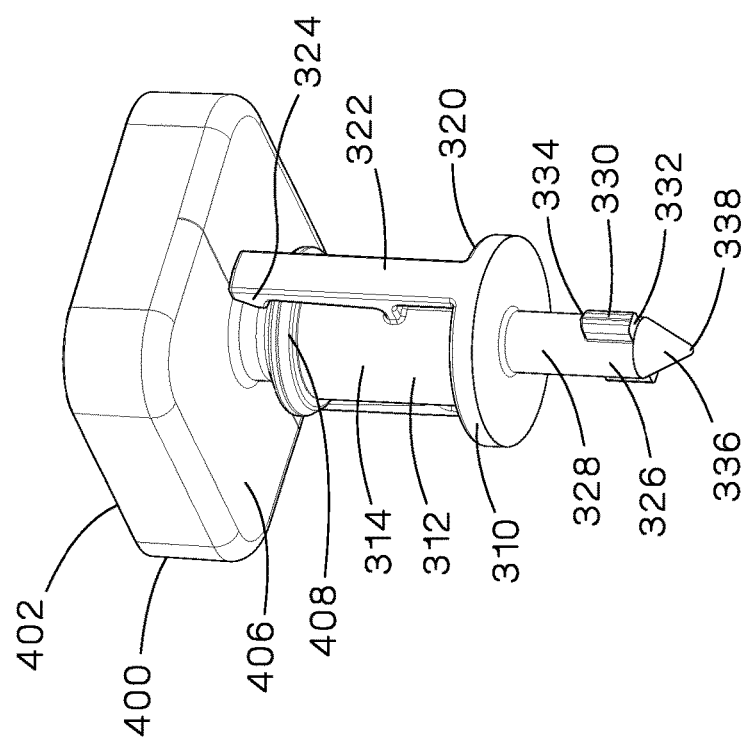
FIG. 15
FIG. 14

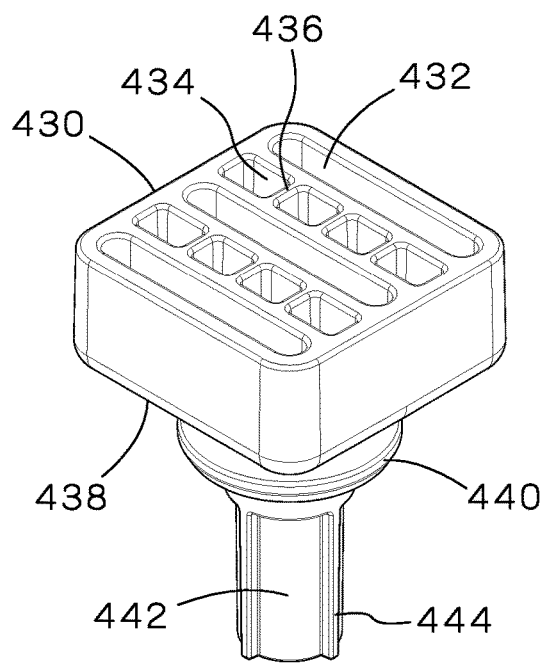
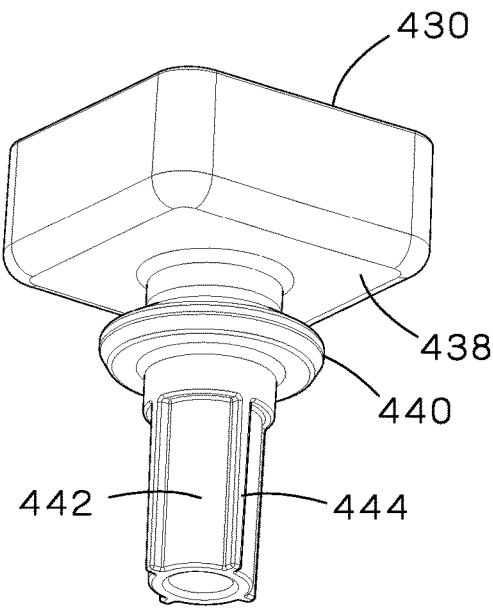
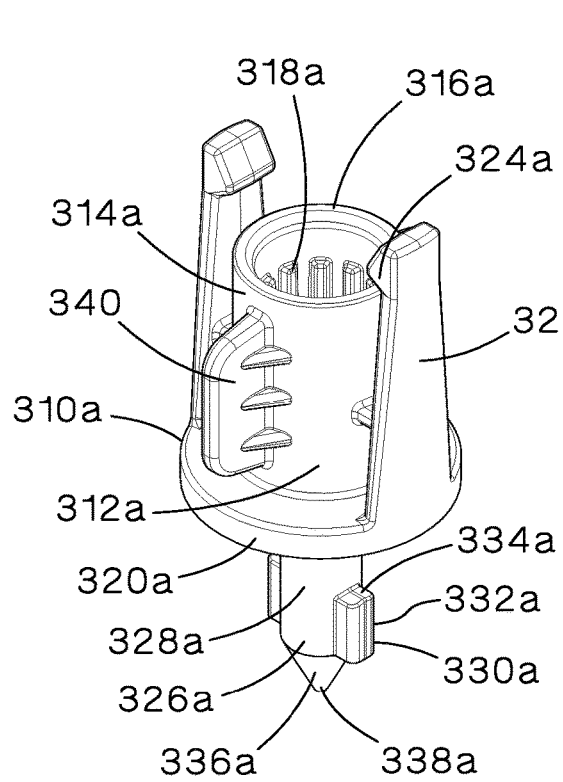
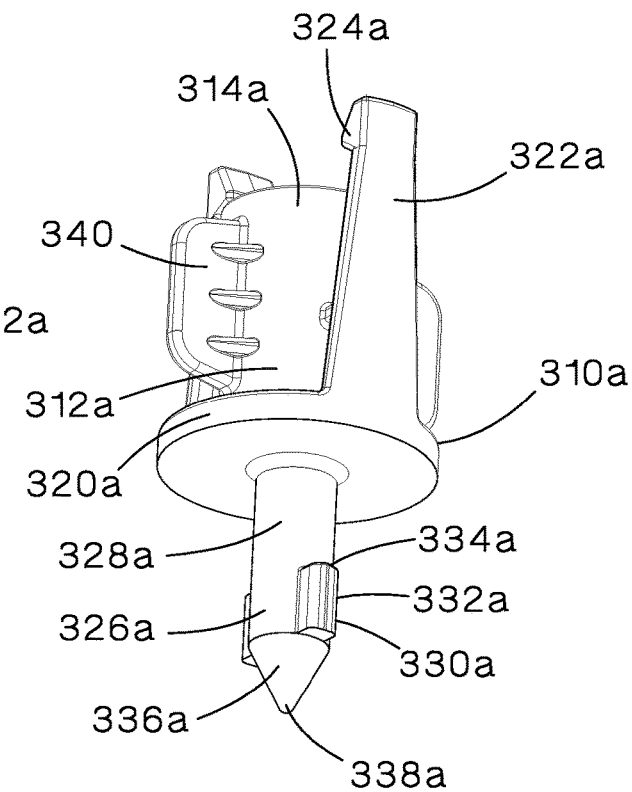
FIG.16  FIG.17

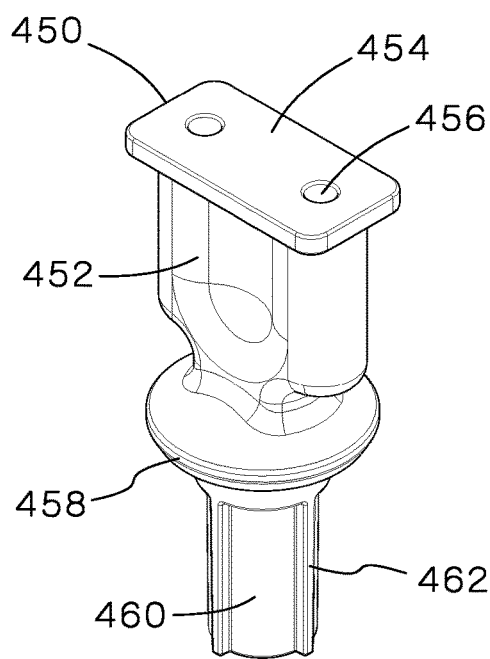
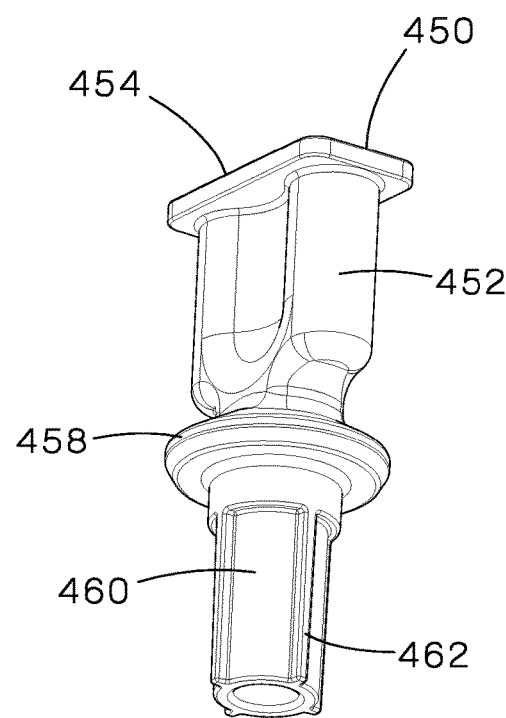
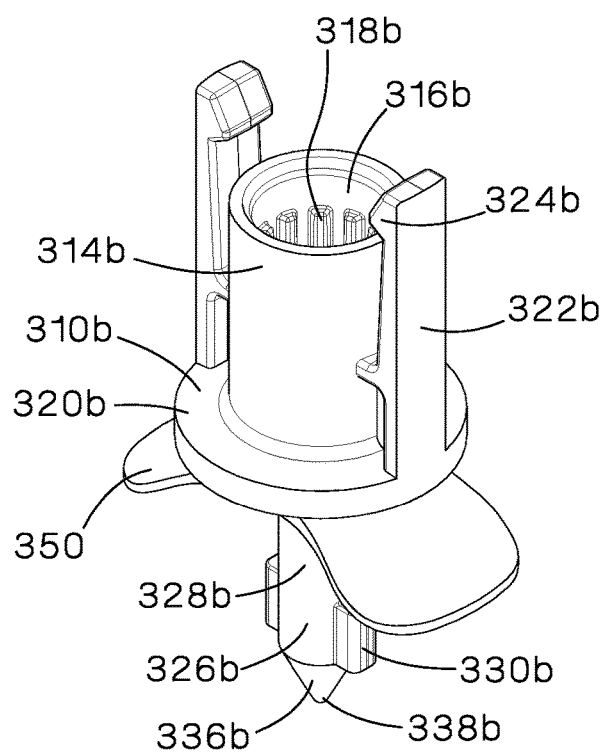
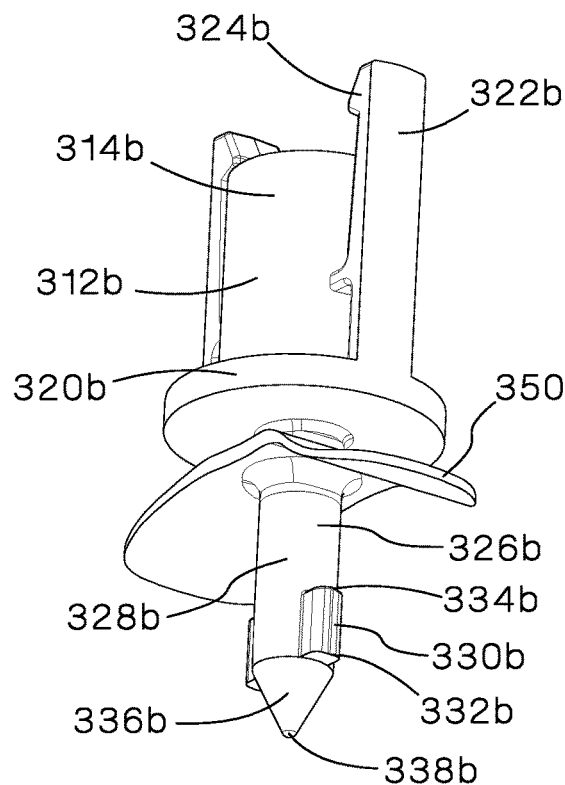
FIG.18  FIG.19

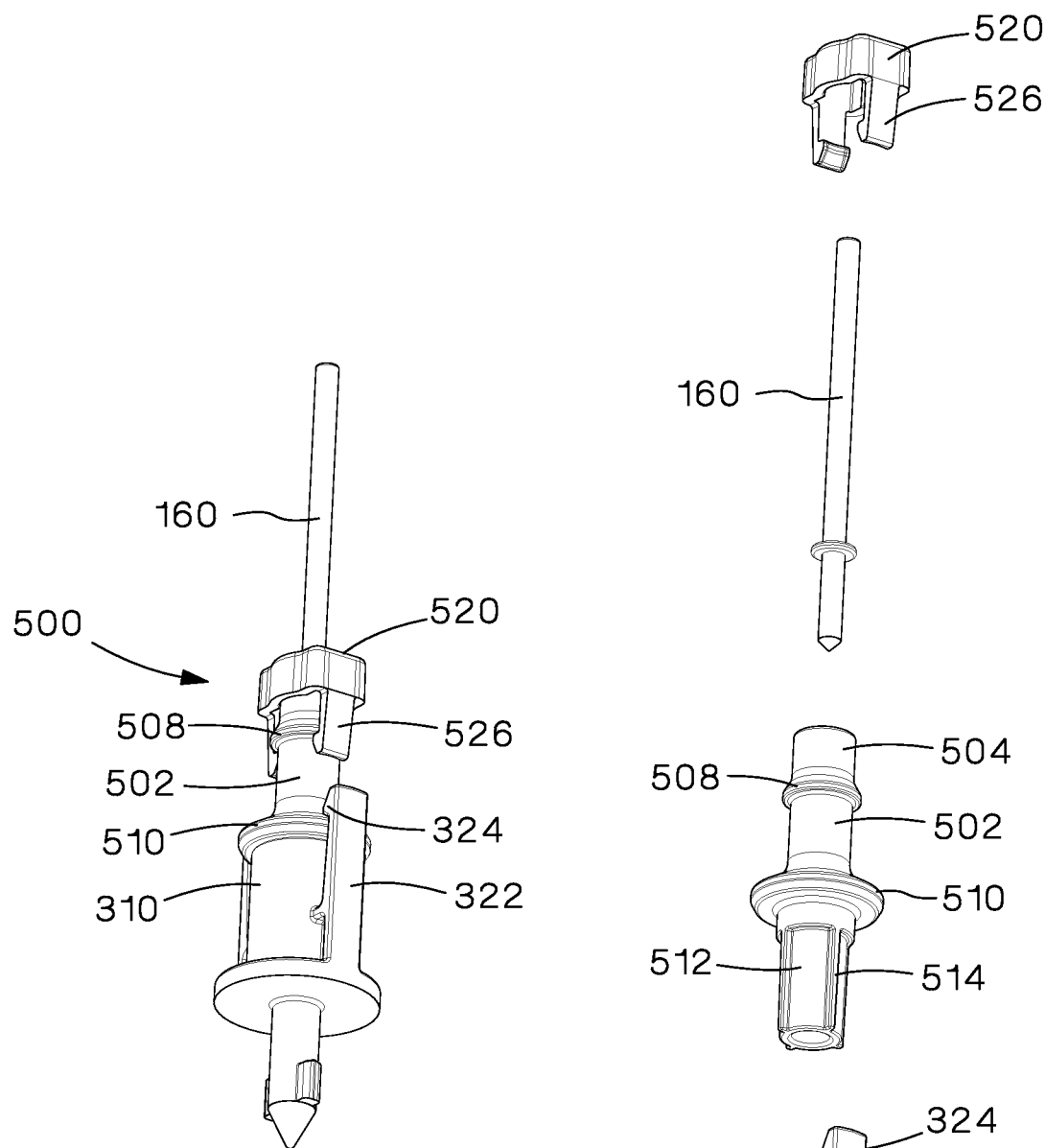
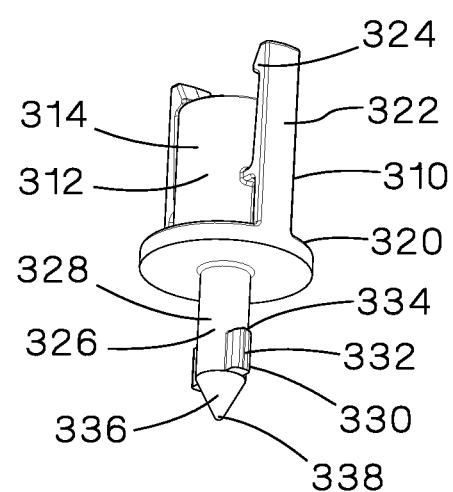
FIG.22
FIG.23

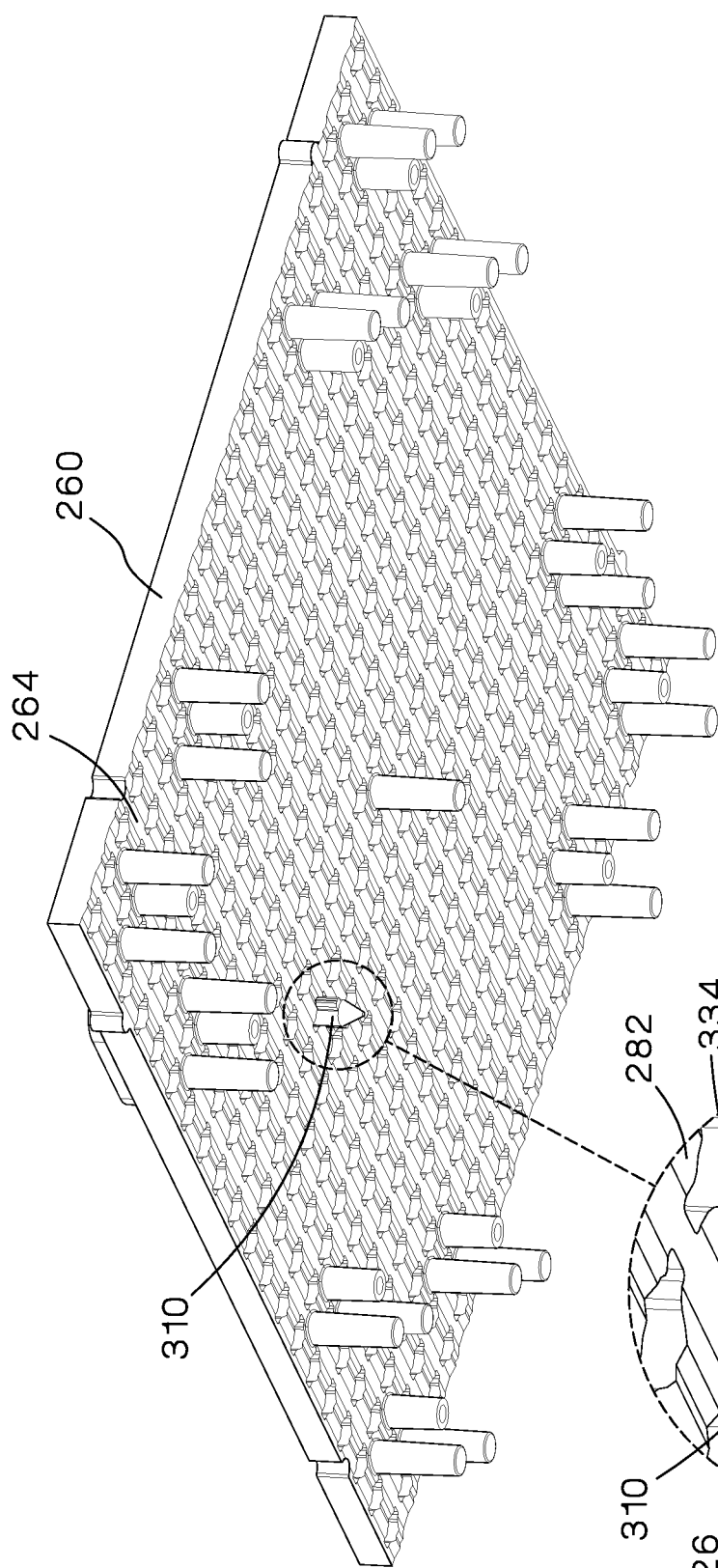
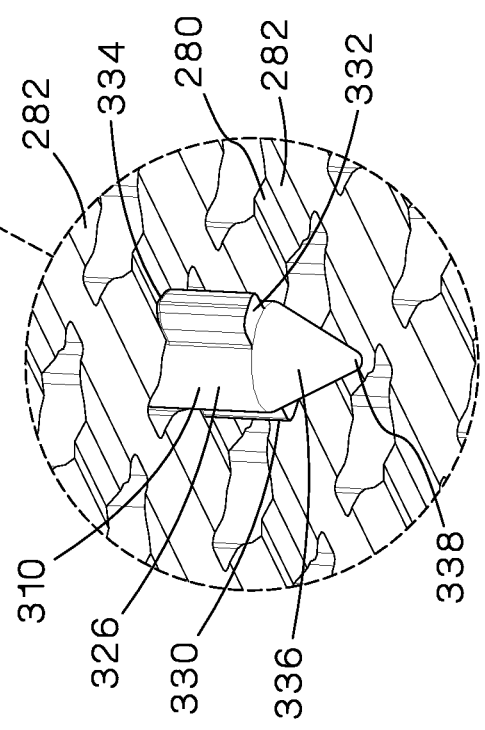
FIG.29
FIG.30

WIRE HARNESS ASSEMBLY SYSTEM

CROSS REFERENCE TO RELATED APPLICATIONS

This utility application claims priority to U.S. Provisional Patent Application Ser. No. 62/158,880 filed May 8, 2015, entitled "Wire Harness Assembly System" and U.S. Provisional Patent Application Ser. No. 62/073,665 filed Oct. 31, 2014, entitled "Wire Harness Assembly System", which are hereby incorporated by reference in their entirety.

FIELD OF THE INVENTION

The present invention relates to a wire harness assembly system, and more particularly to a wire harness assembly system with keyed locking mounts.

BACKGROUND OF THE INVENTION

It is common practice to provide a panel board to mount a plurality of wire mounts or other accessories to route wires. Typically the panel board includes a plurality of circular holes designed to receive the mounts. A paper cover is often positioned over the panel board. The paper cover has markings as to where the mounts and wires should be located. Mounts or accessories are installed over the paper on the panel board. The wires are routed through the mounts between their desired termination points. After the wires are installed, the wires are typically bundled together to form a wire harness assembly. The wire harness assembly is then shipped to the customer.

There is a need for an improved wire harness assembly process that is flexible and easy to assemble for faster routing of wires. There is also a need for an improved wire harness assembly system with mounts that are easily installed and secured to the wire harness tiles.

SUMMARY OF THE INVENTION

The present invention is directed to a wire harness assembly system. The wire harness assembly system includes at least one grid tile. The grid tile includes a top, a bottom, and sides. The grid tile also includes a plurality of keyed holes that extend from the top, through the grid tile, to the bottom of the grid tile. The plurality of keyed holes receive repositionable accessories that route wires along the grid tile. The grid tile also includes a locking surface on the bottom of the grid tile. The locking surface complements the plurality of keyed holes to receive and maintain the repositionable accessories in a locked position.

The wire harness assembly system also includes a locking mount positioned in the keyed holes in the grid tile. The locking mount includes a main body with an upper portion, a base flange, and a lower portion. The lower portion includes a locating shaft with keyed members positioned opposite each other. Once installed in the grid tile, the locking mount is rotated to a locked position in the grid tile. The locking mount receives various wire routing accessories designed to route wires along the grid tile.

BRIEF DESCRIPTION OF THE DRAWINGS

FIG. 8 is a perspective view of a nail and mounting block positioned to be installed in the keyed locking mounts secured to the wire harness tile of FIG. 1.

FIG. 9 is a side view of the wire harness tile of FIG. 8 with the nail and mounting block installed in the keyed locking mounts.

FIG. 12 is a top perspective view of the fixture mounting block and keyed locking mount of FIG. 11.

FIG. 13 is a top exploded view of the fixture mounting block and keyed locking mount of FIG. 12.

FIG. 14 is a bottom perspective view of the fixture mounting block and keyed locking mount of FIG. 12.

FIG. 15 is a bottom exploded view of the fixture mounting block and keyed locking mount of FIG. 14.

FIG. 16 is a top exploded perspective view of an alternative fixture mounting block and keyed locking mount.

FIG. 17 is a bottom exploded perspective view of the alternative fixture mounting block and keyed locking mount of FIG. 16.

FIG. 18 is a top exploded perspective view of an alternative fixture mounting block and keyed locking mount.

FIG. 19 is a bottom exploded perspective view of the alternative fixture mounting block and keyed locking mount of FIG. 18.

FIG. 22 is a bottom perspective view of the harness board nail holder assembly of FIG. 20.

FIG. 23 is a bottom exploded view of the harness board nail holder assembly of FIG. 22.

FIG. 29 is a bottom perspective view of the wire harness assembly of FIG. 11.

FIG. 30 is a sectional view of the keying features of the keyed locking mount of FIG. 29 in a locked position.

DETAILED DESCRIPTION

Figure 1:
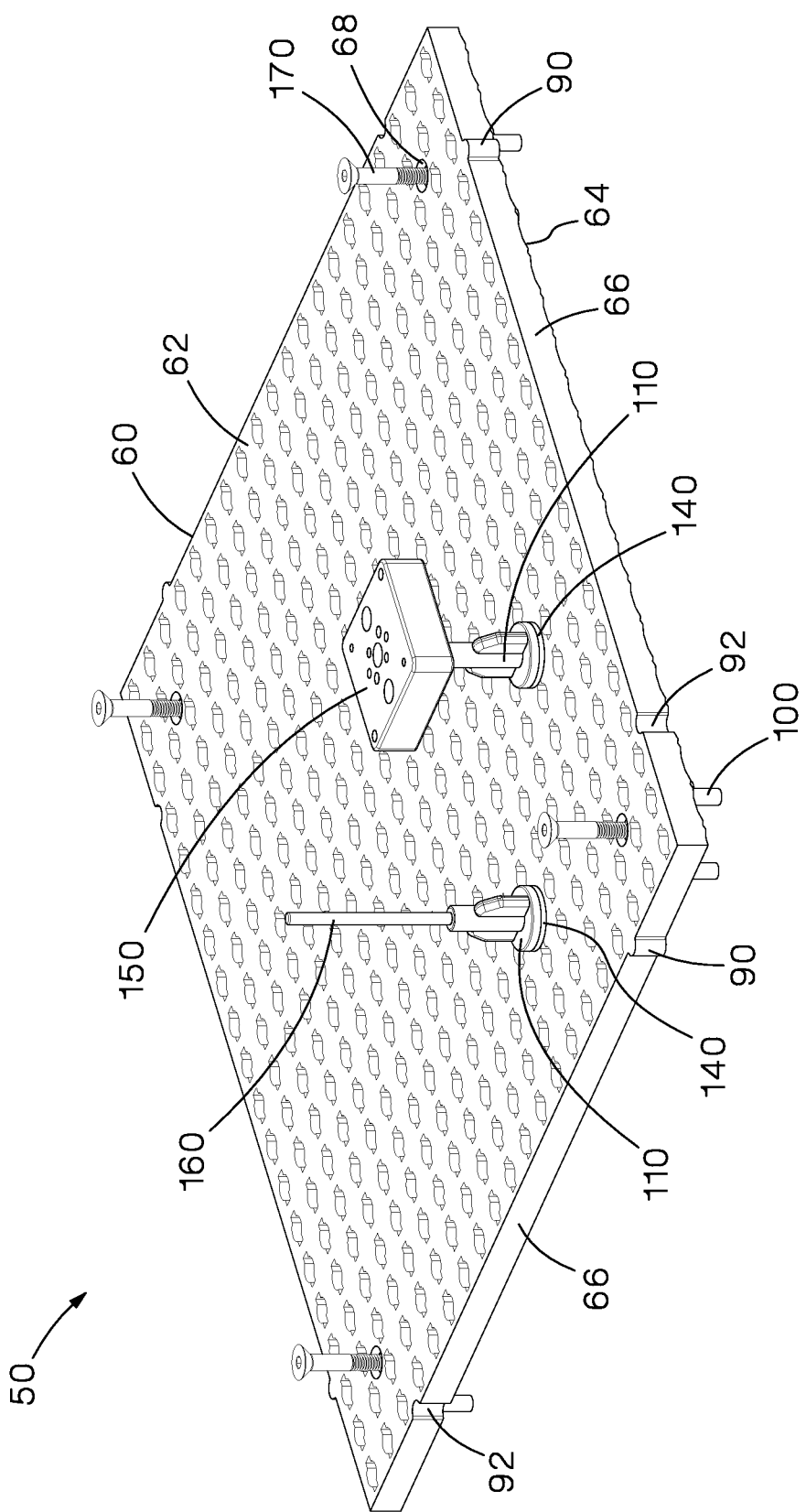
FIG. 1 is a perspective view of the wire harness assembly system with keyed locking mounts installed on a wire harness tile.

FIG. 1 illustrates a wire harness assembly system 50 with keyed locking mounts or mounting pegs 110 installed on a wire harness grid tile 60. The wire harness assembly system 50 includes wire harness grid tiles 60 that interlock to generate an array of grid tiles. Each wire harness grid tile 60 includes a top 62, a bottom 64 and sides 66. The top 62 includes holes 68 for receiving fasteners 170 to secure the grid tile 60 to a board (not illustrated). The sides 66 include a tongue 90 and groove 92 formation located along the perimeter of the grid tile 60. The tongues 90 and grooves 92 of adjacent grid tiles 60 align and interconnect to form an array of grid tiles.

A plurality of keyed holes 70 extend through the wire harness grid tile 60. The keyed holes 70 include a center circular portion 72 and two side rectangular portions 74. As described below, the keyed holes 70 are designed to receive the keyed locking mounts 110 to form the wire harness assembly system. The rounded hole pattern on the wire harness grid tile 60 may be covered with paper or a laminated sheet 180 (see FIG. 10). The paper or laminated sheet 180 may include markings illustrating a desired wire harness assembly layout.

Figure 5A:
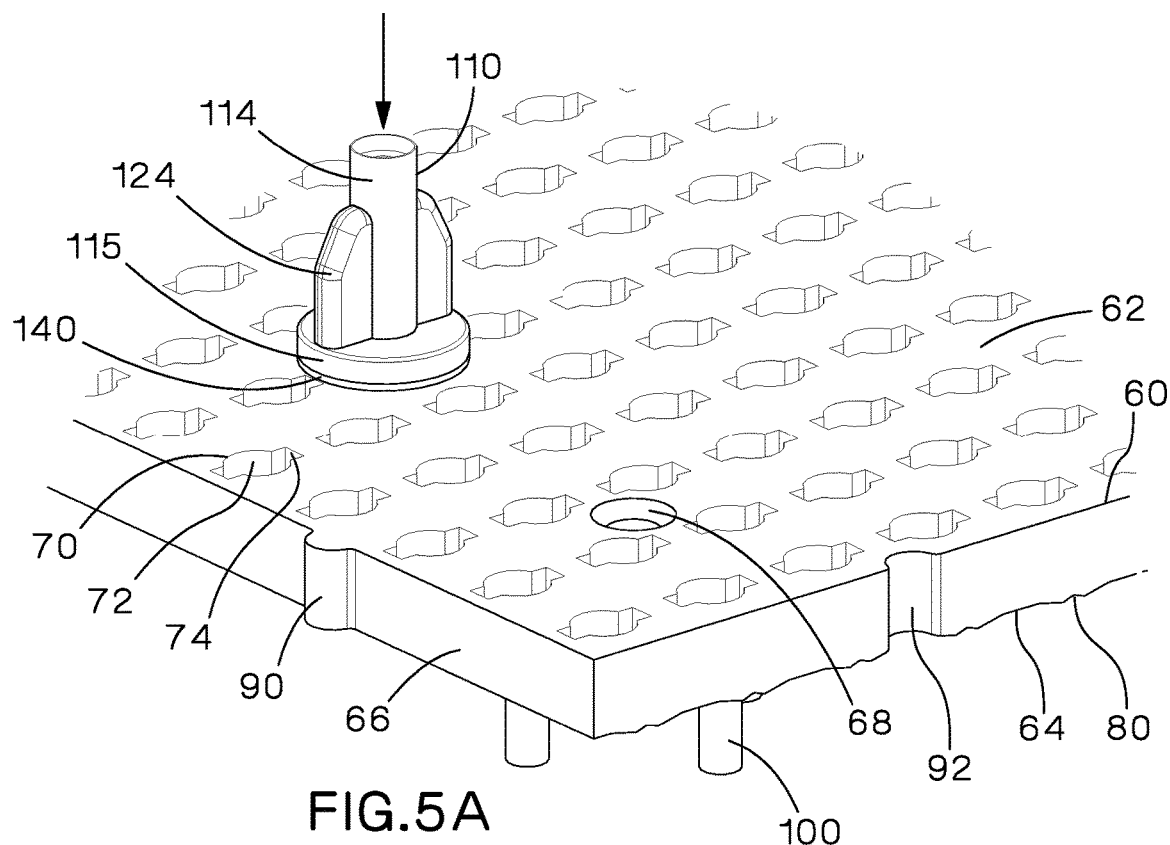
FIG. 5A is a top perspective view of the wire harness assembly system of FIG. 4 with the keyed locking mount inserted therein.
Figure 5B:
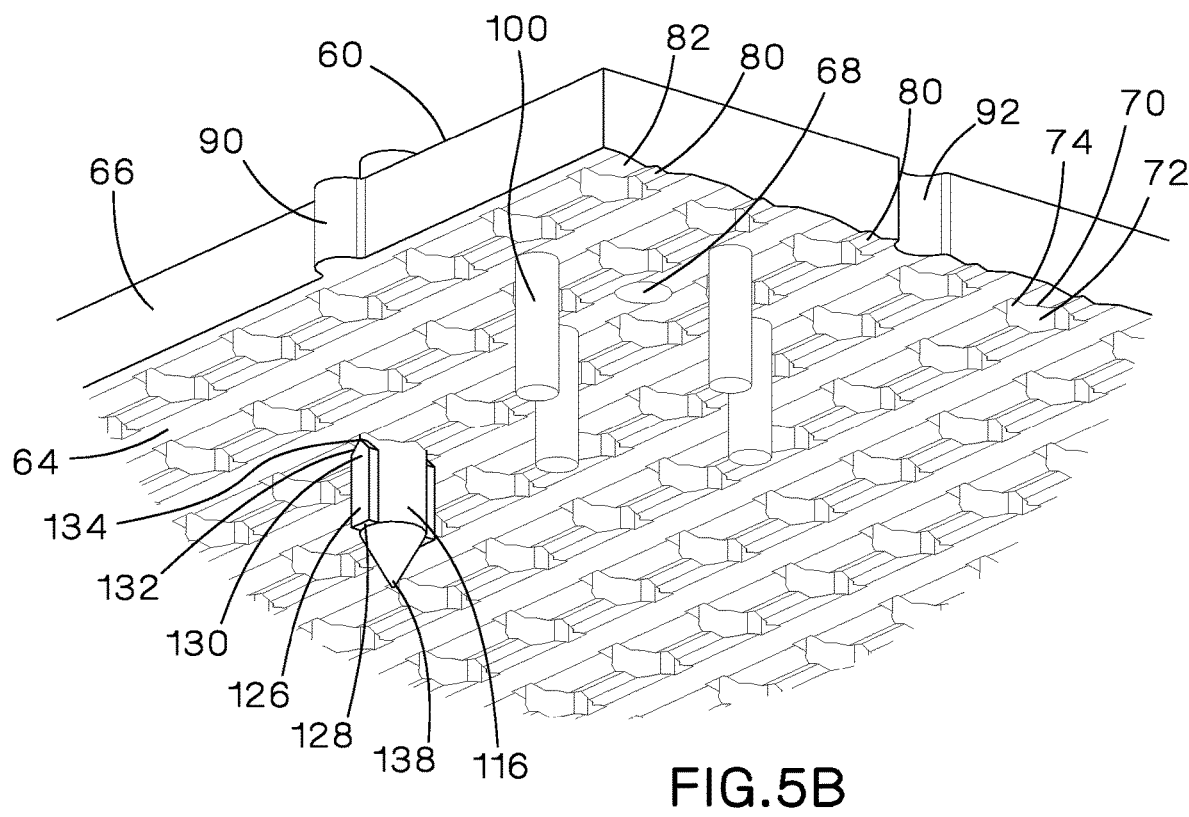
FIG. 5B is a bottom perspective view of the wire harness assembly system and keyed locking mount of FIG. 5A.

As discussed below with respect to FIGS. 5B, 6B, and 7B, the bottom 64 of the wire harness grid tile 60 includes a plurality of V-shaped grooves 80 and a plurality of ramps 82 to secure the keyed locking mounts 110.

A plurality of legs 100 extend from the bottom 64 of the wire harness grid tile 60. The legs 100 enable the wire harness grid tile 60 to be positioned on a table or board to receive wiring harness fixtures and accessories.

Figure 3:
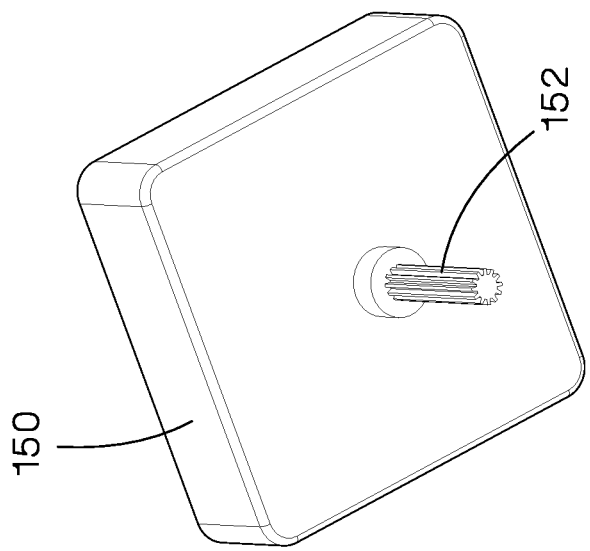
FIG. 3 is a bottom perspective view of the fixture mounting block installed on one of the keyed locking mounts on the wire harness tile of FIG. 1.
Figure 2B:
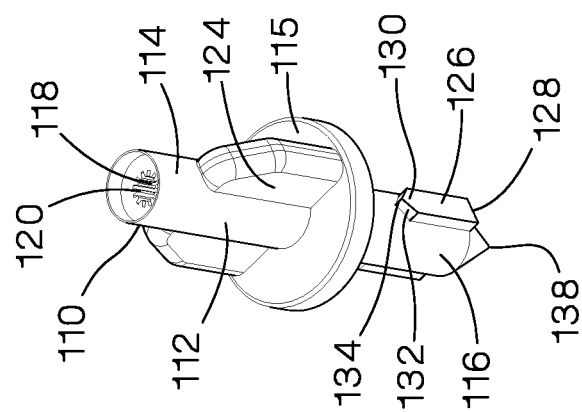
FIG. 2B is a top perspective view of one of the keyed locking mounts installed on the wire harness tile of FIG. 1.
Figure 2A:
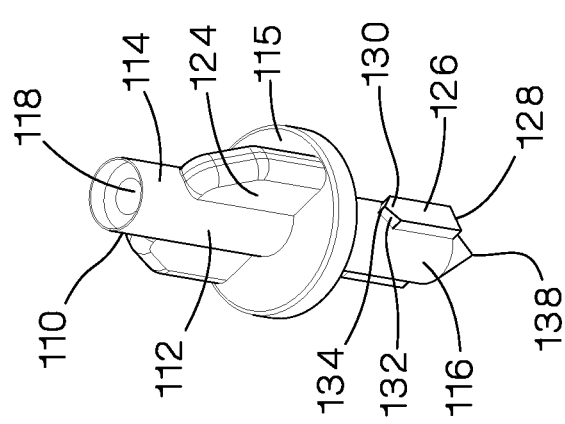
FIG. 2A is a top perspective view of one of the keyed locking mounts installed on the wire harness tile of FIG. 1.

FIGS. 2A and 2B illustrate examples of the keyed locking mounts 110 installed on the wire harness grid tile 60. FIG. 3 illustrates an example of a fixture mounting block or mounting platform 150 installed on one of the keyed locking mounts 110. The fixture mounting block 150 includes a standard hole pattern to attach various wire harness fixtures and accessories. Each keyed locking mount 110 is a cylindrical mount 112 with an upper portion 114, a base 115, and a lower portion 116. As illustrated in FIG. 2A, the upper portion 114 includes an opening 118 for receiving a fixture accessory, such as a nail 160 (see FIG. 1). As illustrated in FIG. 2B, the upper portion 114 includes an opening 118 with splines 120. The splines 120 in the keyed locking mount 110 match the splines 152 extending from the fixture mounting block 150 illustrated in FIG. 3. The splines 120, 152 allow incremental angular positioning of the mounting block 150 with respect to the keyed locking mount 110.

The upper portion 114 of the keyed locking mounts 110 also include wings 124. The wings 124 assist the user in rotating the keyed locking mount 110 to a locked position.

The lower portion 116 of the keyed locking mounts 110 include side projections 126 that are positioned 180 degrees from each other. The side projections 126 include a rectangular bottom portion 128 to facilitate insertion into the keyed holes 70 of the wire harness grid tile 60. The side projections 126 also include a top portion 130 with angled walls 132 that lead to a tip 134 forming an inverted V-shape. The lower portion 116 also includes a pointed end 138 or tip to facilitate installation in the wire harness grid tile 60. If the wire harness grid tile 60 is covered with paper showing the wire harness layout, the pointed end 138 enables the keyed locking mount 110 to push thru the paper to position the keyed locking mount 110 in place on the wire harness grid tile 60.

Figure 4:
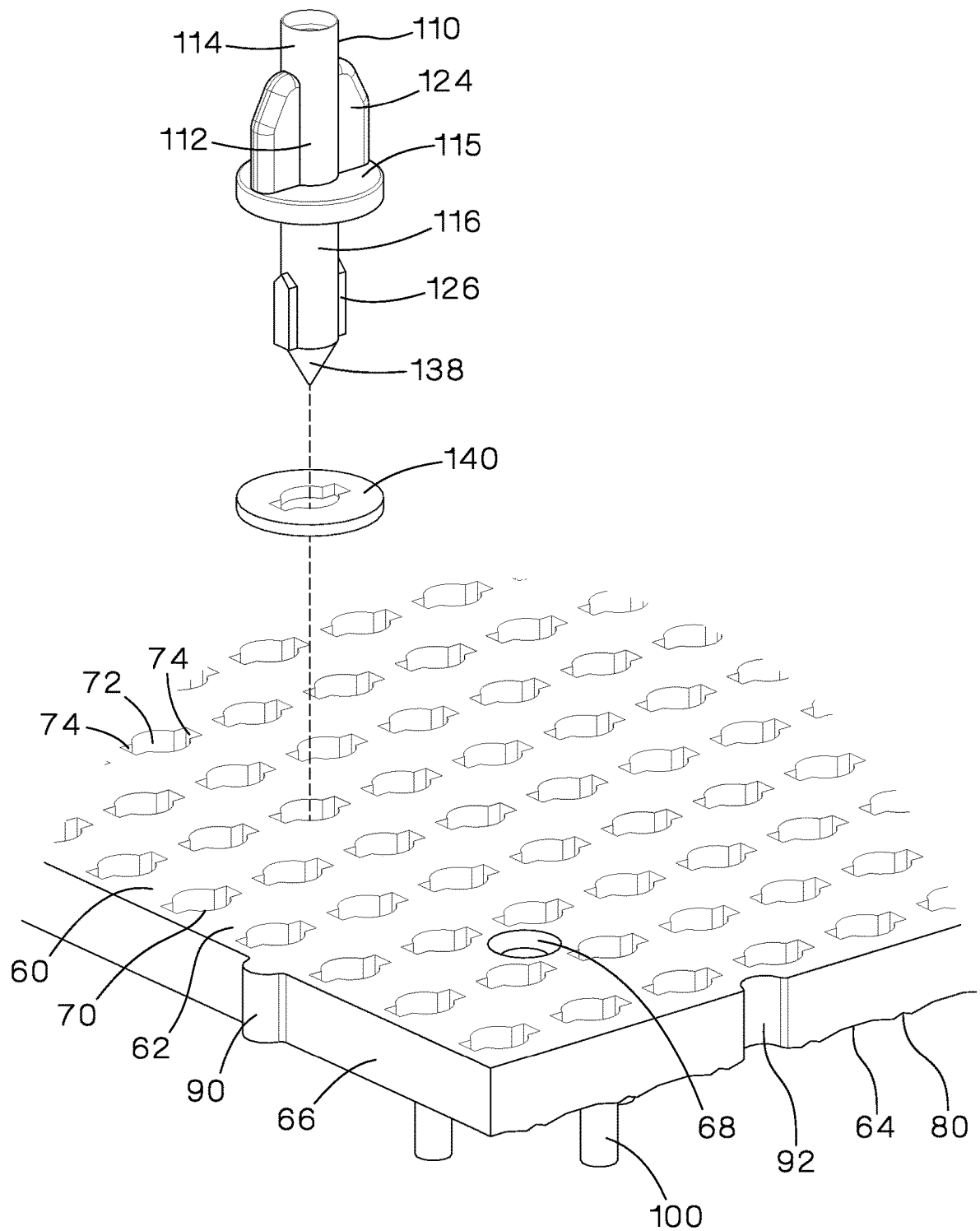
FIG. 4 is a partial exploded view of the wire harness assembly system of FIG. 1 with a keyed locking mount positioned to be installed.

FIGS. 4-7B illustrate the keyed locking mount 110 being installed and secured on a wire harness grid tile 60. As illustrated in FIG. 4, a compressible washer 140 is installed under the keyed locking mount 110. The compressible washer 140 enables the keyed locking mount 110 to be turned and locked while still being firmly held on the wire harness grid tile 60. The compressible washer 140 includes a plastic laminate to reduce friction between the washer 140 and the grid tile 60. The keyed locking mount 110 is positioned such that the side projections 126 are aligned with the side rectangular openings 74 in the keyed holes 70 in the wire harness tile 60. As illustrated in FIGS. 5A and 5B, the keyed locking mount 110 is installed in the wire harness grid tile 60 with the lower portion 116 extending through one of the circular holes 72 and the side projections 126 extending through the side rectangular openings 74. Also, the key locking mount 110 compresses the washer 140 as the keyed locking mount 110 is rotated in the wire harness grid tile 60.

As illustrated in FIGS. 6A-6B and 7A-7B, once the keyed locking mount 110 is inserted into the wire harness grid tile 60, the user rotates the keyed locking mount 110 ninety degrees from an installation position to a locked position.

Figure 7A:
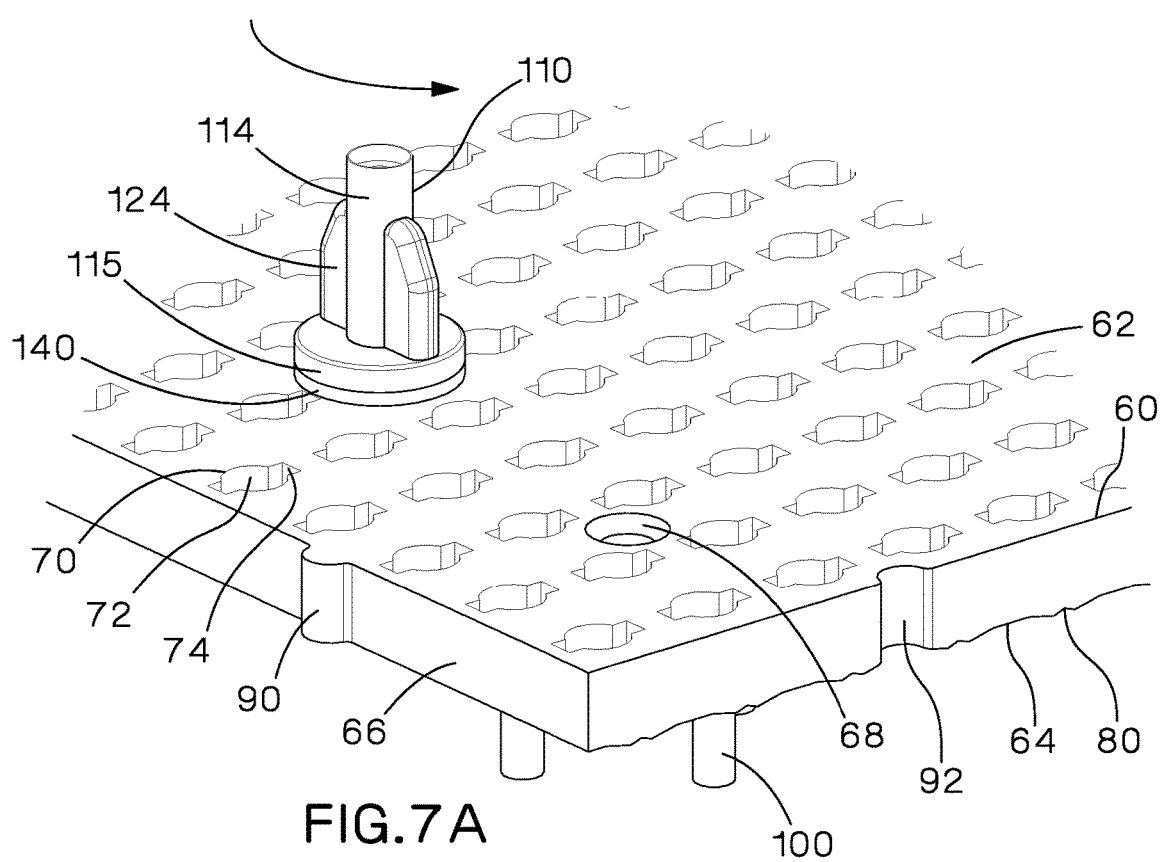
FIG. 7A is a top perspective view of the wire harness assembly system of FIG. 5A with the keyed locking mount rotated to a locked position.

The keyed locking mount 110 compress the washer 140 as it is rotated. As illustrated in FIG. 7A, once the keyed locking mount 110 is locked in a groove 80 and released by the user, the washer 140 expands.

Figure 6A:
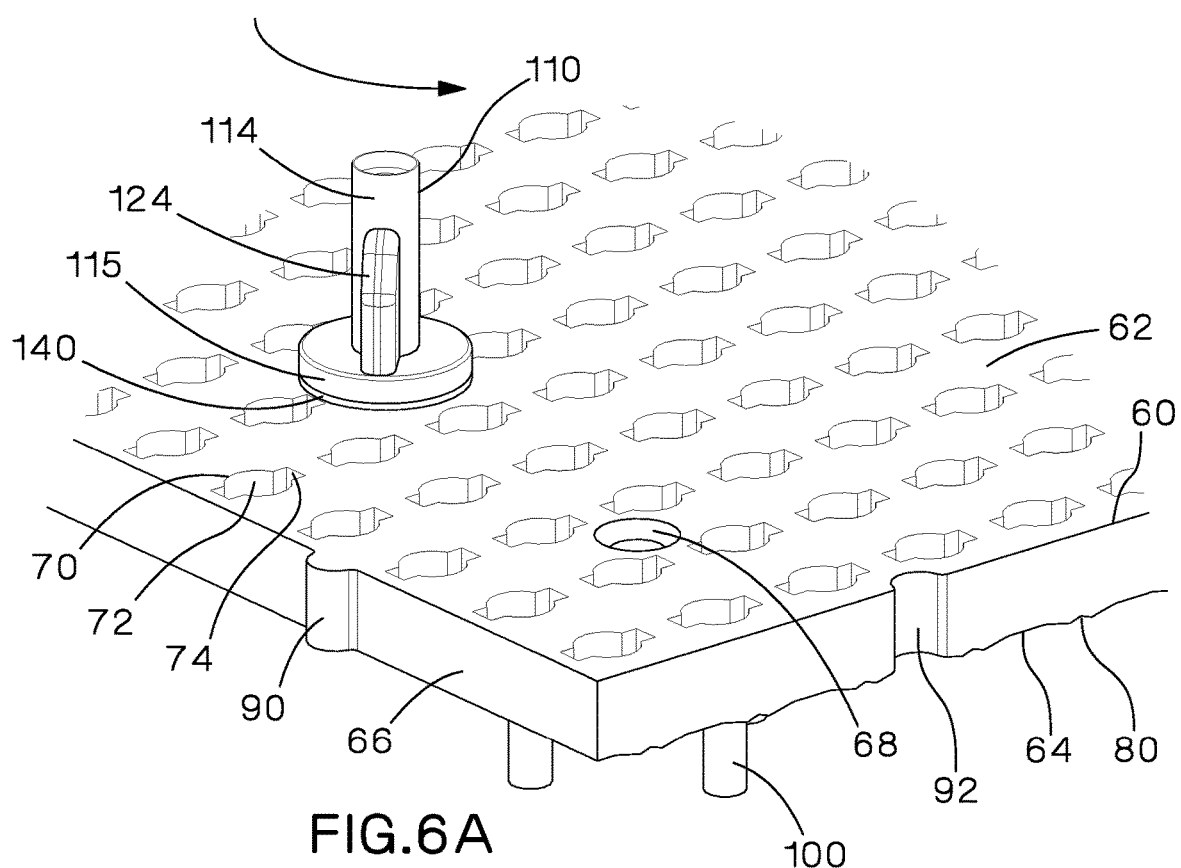
FIG. 6A is a top perspective view of the wire harness assembly system of FIG. 5A with the keyed locking mount partially rotated towards a lock position.
Figure 6B:
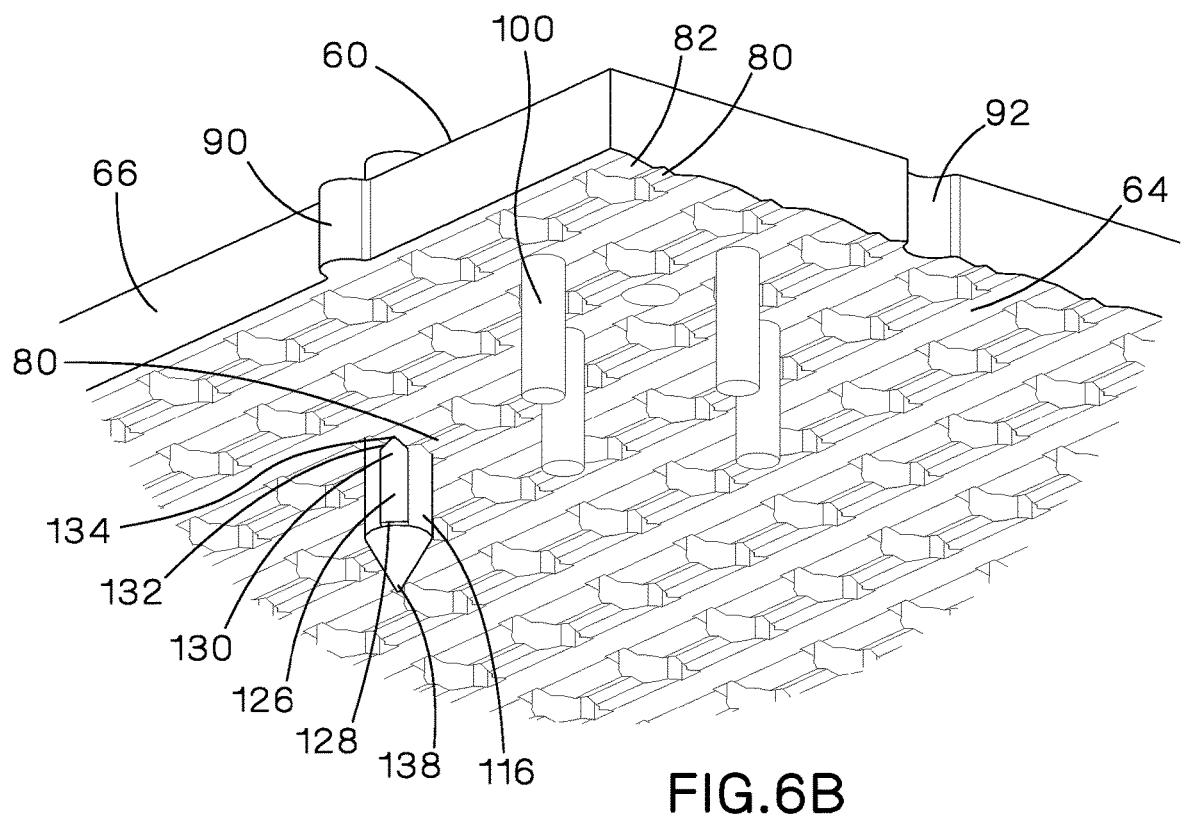
FIG. 6B is a bottom perspective view of the wire harness assembly system and keyed locking mount of FIG. 6A.
Figure 7B:
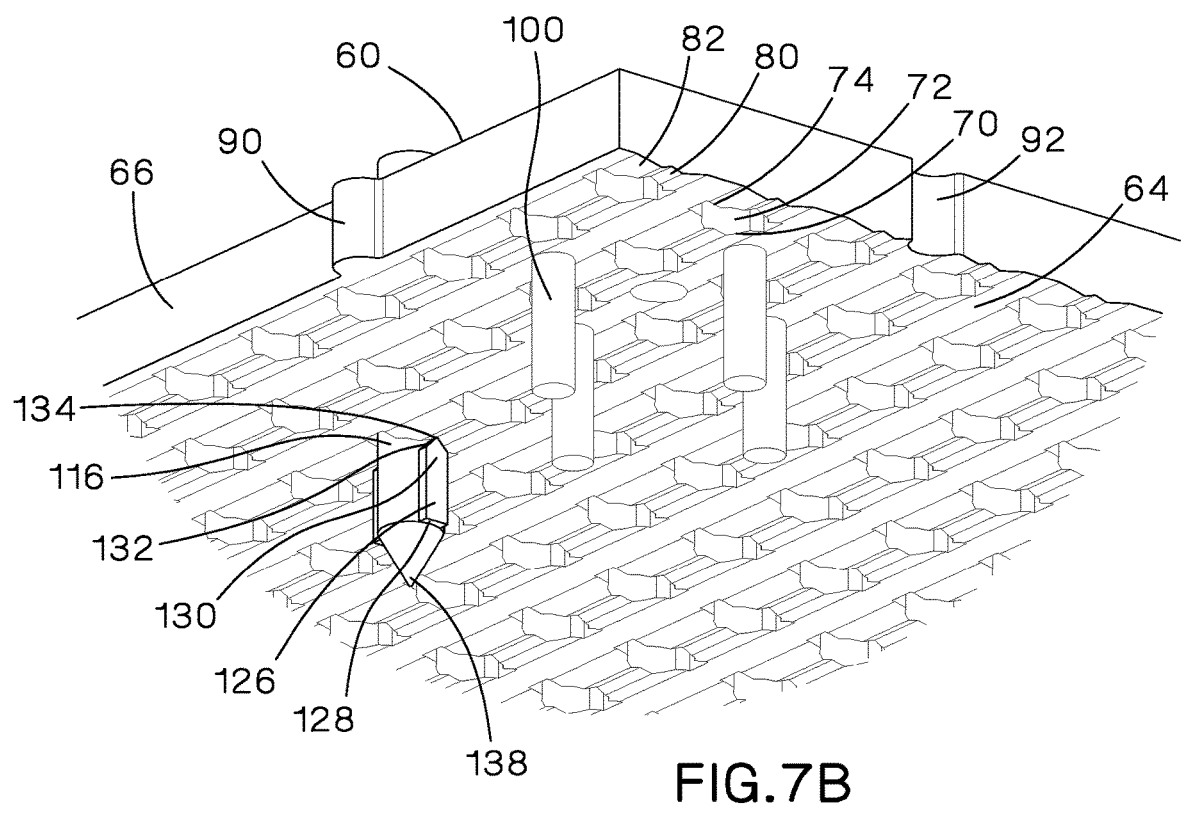
FIG. 7B is a bottom perspective view of the wire harness assembly system and keyed locking mount of FIG. 7A.

FIGS. 6B and 7B illustrate the locking feature for the keyed locking mounts 110 on the wire harness grid tiles 60. As discussed above, the bottom 64 of each wire harness grid tile 60 includes ramps 82 adjacent the V-shaped grooves 80. The side projections 126 extending from the lower portions 116 of the keyed locking mounts 110 travel along the ramps 82 as the keyed locking mount 110 is rotated ninety degrees from an installation position to a locked position. As illustrated in FIG. 7B, the inverted V-shaped top portion 130 of each side projection 126 is positioned in one of the V-shaped grooves 80 in the bottom 64 of the grid tile 60 to secure the keyed locking mount 110 to the wire harness grid tile 60.

As illustrated in FIGS. 8-9, once the keyed locking mounts 110 are secured to the wire harness grid tile 60, mounting blocks 150, nails 160, or other accessories may be installed in the keyed locking mounts 110.

Figure 10:
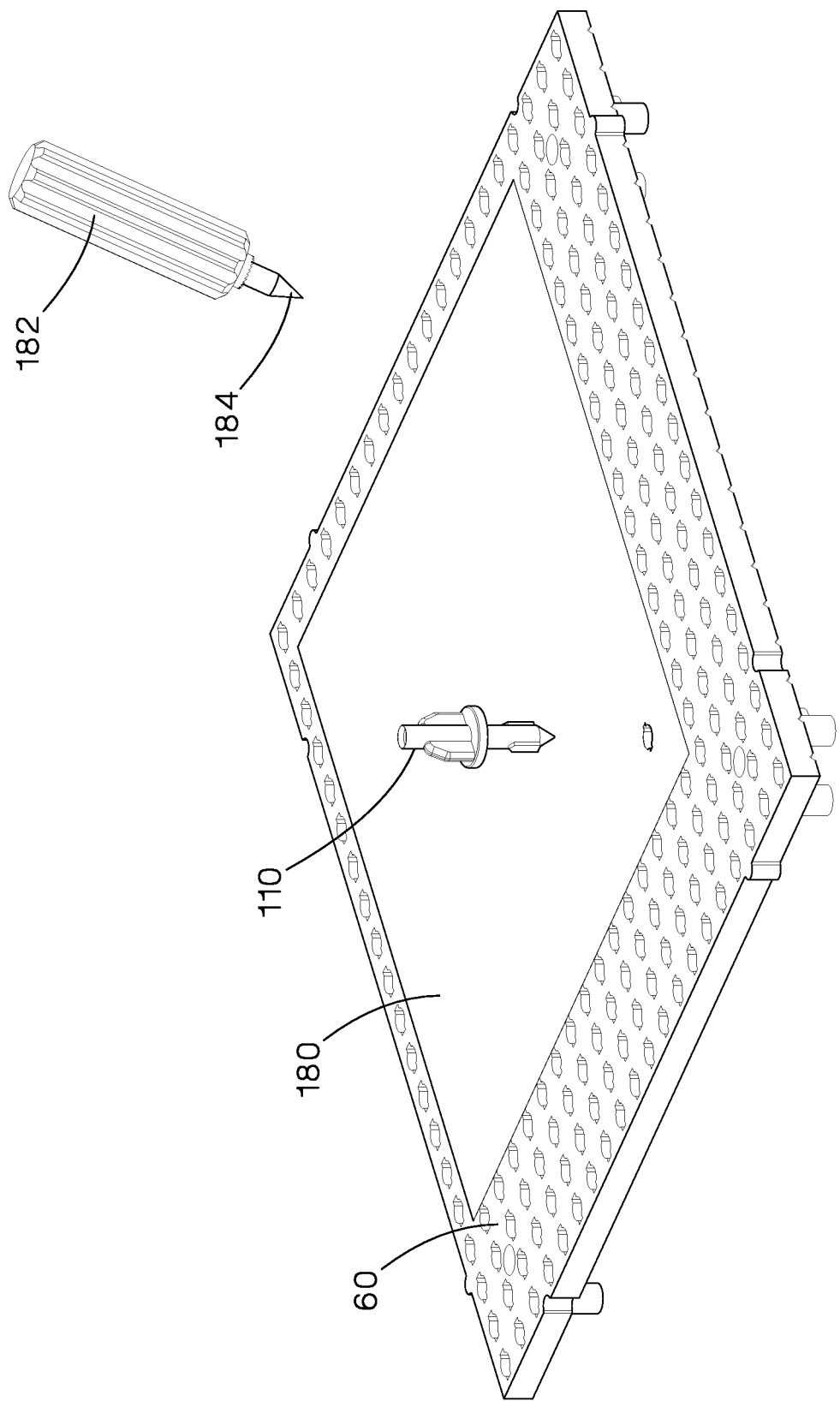
FIG. 10 is a top perspective view of a keyed locking mount positioned to be installed on the wire harness tile of FIG. 1 covered with a laminated harness layout sheet.

Additionally, as illustrated in FIG. 10, the wire harness grid tile 60 may be covered with a laminated harness layout sheet 180. If laminated harness layout sheets 180 are used, a tool 182 with a cutter blade 184 is used to make the holes for the keyed locking mounts 110. The laminated side of the washer 140 reduces friction between the washer 140 and the layout sheet 180 to prevent the sheet from tearing during installation.

FIGS. 11-38 illustrate a wire harness assembly system 250 including a wire harness grid tile 260 and keyed locking mounts or mounting pegs 310 with a nail holder assembly and mounting block secured thereto. The wire harness grid tile 260 is similar to the wire harness grid tile 60, discussed above. The wire harness grid tile 260 includes a top 262, bottom 264, sides 266, and holes 268. The sides 266 of grid tile 260 include tongues 290 and grooves 292 for enabling grid tiles 260 to interlock to generate an array of grid tiles.

Each grid tile 260 also includes a plurality of keyed holes 270 for receiving the keyed locking mounts 310. Similar to the grid tile 60 described above, the keyed holes 270 in the grid tile 260 have a center circular portion 272 and two side rectangular portions 274. The bottom 264 of the grid tile 260 includes a plurality of V-shaped grooves 280 and a plurality of ramps 282 (see FIGS. 29-30) to secure the keyed locking mounts 310. The grid tile 260 includes a plurality of legs 300 extending from the bottom 264 of the grid tile 260.

As described above, the rounded hole pattern maybe covered with paper or a laminated sheet. The paper or laminated sheet may include markings illustrating a desired wire harness assembly layout.

Figure 11:
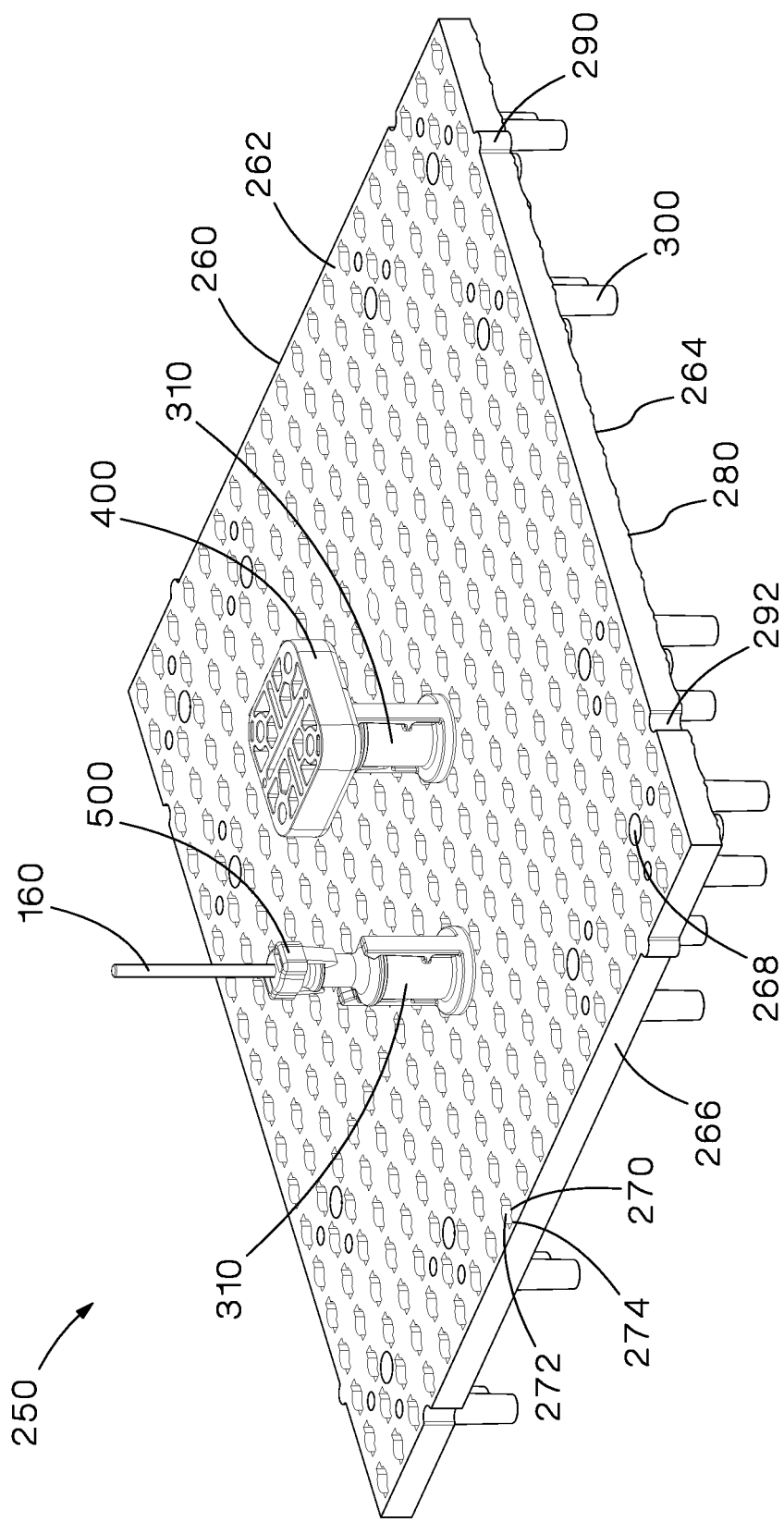
FIG. 11 is a top perspective view of an alternative wire harness assembly system with keyed locking mounts installed on a wire harness tile.
Figure 20:
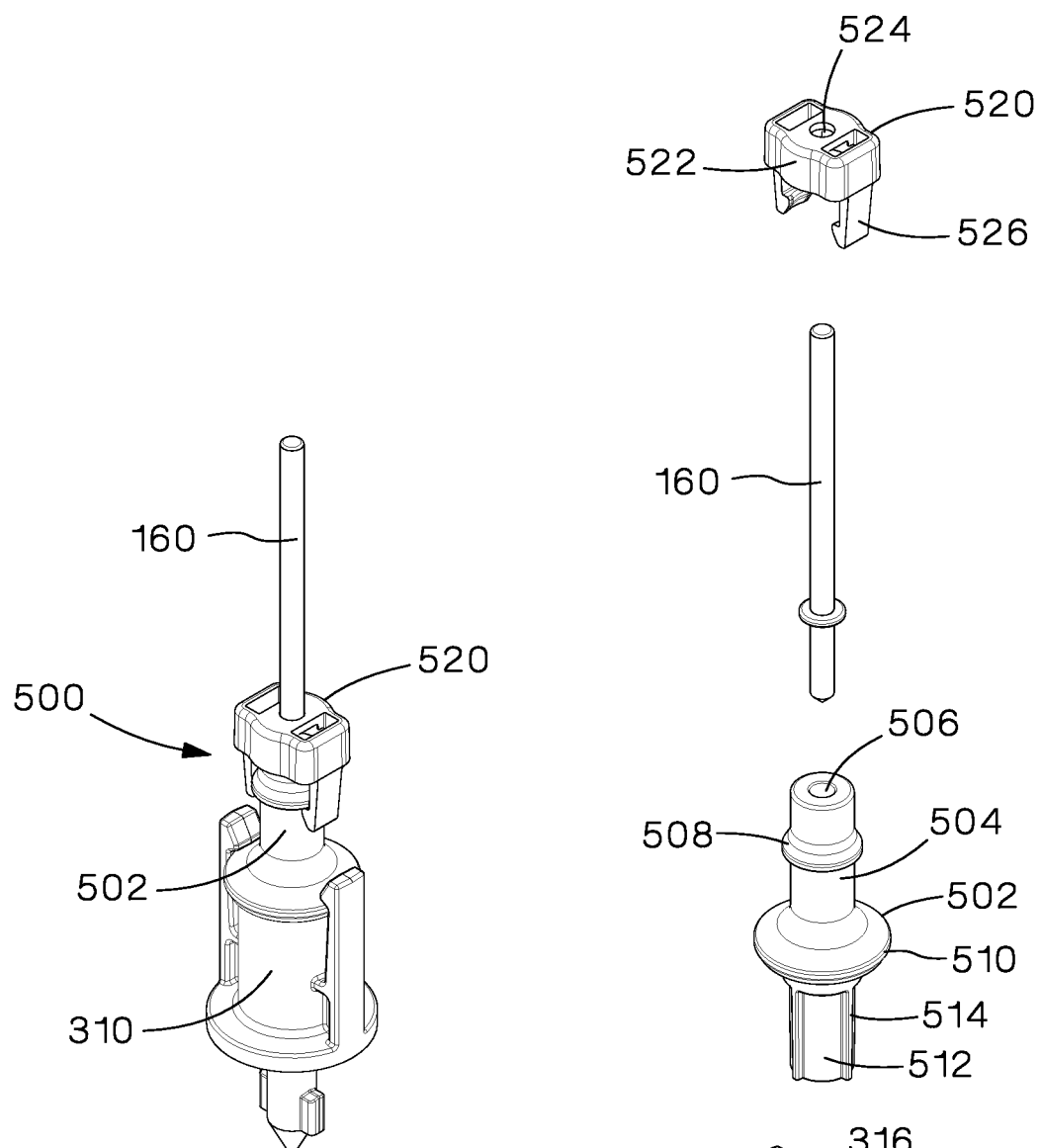
FIG. 20 is a top perspective view of a harness board nail holder assembly mounted to the keyed locking mount of FIG. 11.
Figure 21:
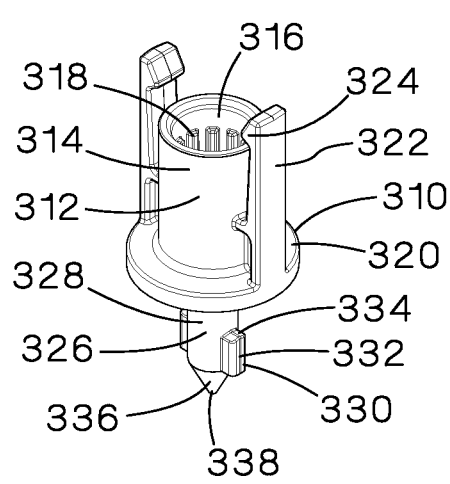
FIG. 21 is an exploded view of the harness board nail holder assembly of FIG. 20.

FIGS. 12-15 illustrate a keyed locking mount 310 and fixture mounting block or mounting platform 400 that is installed in the wire harness grid tile 260 illustrated in FIG. 11. The fixture mounting block 400 is rectangular with a top 402 and bottom 406. The top 402 has a plurality of holes 404 and slots 405 arranged in a pattern for receiving various wire harness fixtures and accessories. A latching collar 408 and a mounting barrel 410 extend from the center of the bottom 406 of the fixture mounting block 400. The mounting barrel 410 includes a plurality of external splines 412 extending outwardly from the mounting barrel 410. Each external spline 412 is positioned equidistance from an adjacent external spline 412.

The keyed locking mount 310 is similar to the keyed locking mounts 110 described above. The keyed locking mount 310 includes a cylindrical main body 312 with an upper portion 314, a base flange 320, and a lower portion 326. The upper portion 314 includes a round well 316 with a plurality of internal splines 318 positioned therein. The internal splines 318 are positioned equidistant from each other. The mounting barrel 410 of the mounting block 400 is inserted in the round well 316. The internal splines 318 of the round well 316 accommodate the external splines 412 extending from the mounting barrel 410. The internal and external splines 318, 412, respectively, allow incremental angular positioning of the fixture mounting block 400 with respect to the keyed locking mount 310.

Snap-in latches 322 extend upwardly from the base flange 320 above the round well 316. The distal end of each snap-in latch 322 includes a hook 324 for engaging the latching collar 408 of the mounting block 400.

The lower portion 326 of the keyed locking mount 310 includes a locating shaft 328 that extends from the base flange 320. The lower portion 326 includes keying features 330 positioned on opposite sides of the locating shaft 328. The keying features 330 include a rectangular side projection 332 with an angled top portion 334. The lower portion 326 also includes a tip 336 with a pointed end 338. Once installed in the wire harness grid tile 260, the key locking mount 310 remains fixed until it is removed by the user.

FIGS. 16-19 illustrate alternative embodiments of the mounting block or mounting platform and the keyed locking mount or mounting pegs. In FIGS. 16 and 17, the mounting block is a tri-slot mounting block 430 with three parallel mounting slots 432. The mounting block 430 also includes a plurality of reinforcing ribs 436 between the walls 434 of adjacent mounting slots 432. The arrangement of the ribs 436 results in a pattern similar to that of rectangular pockets. However, the rectangular pockets do not serve as mounting features. The mounting slots 432 may accommodate smaller fixtures placed entirely on a single mount, or larger fixtures placed on two or more mounts spaced accordingly on a wire harness grid tile. Although the mounting block 430 is illustrated with three parallel mounting slots 432, the mounting block 430 may have a single slot or any number of parallel mounting slots, as desired. As described above with respect to the mounting block 400, the mounting block 430 also includes a bottom 438 with a latching collar 440 to receive the snap-in latches 322a of the keyed locking mount 310a and a mounting barrel 442 with external splines 444 to be inserted in the well 316a of a keyed locking mount 310a.

The keyed locking mount 310a is similar to the keyed locking mount 310. The keyed locking mount 310a includes a cylindrical main body 312a with an upper portion 314a, a base flange 320a, and a lower portion 326a. The upper portion 314a includes a round well 316a with a plurality of internal splines 318a positioned therein. The internal splines 318a are positioned equidistant from each other. Snap-in latches 322a extend upwardly from the base flange 320a above the round well 316a. The distal end of each snap-in latch 322a includes a hook 324a. The lower portion 326a of the keyed locking mount 310a includes a locating shaft 328a that extends from the base flange 320a. The lower portion 326a includes keying features 330a positioned on opposite sides of the locating shaft 328a. The keying features 330a include a rectangular side projection 332a with an angled top portion 334a. The lower portion 326a also includes a tip 336a with a pointed end 338a.

The keyed locking mount 310a includes the additional feature of outwardly extending wings 340. The wings 340 extend from the upper portion 314a to assist the user in rotating the locking mount 310 to a locked position. Although the mounting block 430 is illustrated with a keyed locking mount 310a with wings 340, it could also be used with the keyed locking mount 310 without wings or the alternative keyed locking mount 310b with a flexible flange 350 (see FIGS. 18 and 19).

An alternative keyed locking mount 310b is illustrated in FIGS. 18 and 19. The keyed locking mount 310b is similar to the keyed locking mounts 310, 310a. The keyed locking mount 310b includes a cylindrical main body 312b with an upper portion 314b, a base flange 320b, and a lower portion 326b. The upper portion 314b includes a round well 316b with a plurality of internal splines 318b positioned therein. The internal splines 318b are positioned equidistant from each other. Snap-in latches 322b extend upwardly from the base flange 320b above the round well 316b. The distal end of each snap-in latch 322b includes a hook 324b. The lower portion 326b of the keyed locking mount 310b includes a locating shaft 328b that extends from the base flange 320b. The lower portion 326b includes keying features 330b positioned on opposite sides of the locating shaft 328b. The keying features 330b include a rectangular side projection 332b with an angled top portion 334b. The lower portion 326b also includes a tip 336b with a pointed end 338b.

The alternative keyed locking mount 310b also includes a flexible flange 350 that extends outwardly from the lower portion 326b. As described below with respect to FIGS. 31-34, the flexible flange 350 compresses to enable the keyed locking mount 310b and attached mount to be installed in a wire harness grid tile 260.

The mounting block is a compact fixture mount 450 designed to accommodate a variety of small fixtures. The compact fixture mount 450 includes a main body 452 having a top rectangular pad 454 with a pair of mounting holes 456, a latching collar 458 and a mounting barrel 460 with external splines 462. The snap-in latches 322b of the keyed locking mount 310b engage the latching collar 458 and the mounting barrel 460 with external splines 462 is positioned within the round well 316b to secure the compact fixture mount 450 to the keyed locking mount 310b. Depending on the intended mounting arrangement, a user might choose the compact fixture mount 450 which provides the benefit of closer fixture spacing on the wire harness tile.

Although the compact fixture mount 450 is illustrated with the keyed locking mount 310b having a flexible flange 350, it could also be used with the keyed locking mount 310 or the keyed locking mount 310a with wings 340.

FIGS. 20-27 illustrate the keyed locking mount 310, a single nail holder assembly 500, and a five nail holder assembly 550. Each of the nail holder assemblies 500, 550 is designed to be installed in one of the keyed locking mounts 310, 310a, 310b illustrated and discussed above with respect to FIGS. 12-19. The single nail holder assembly 500 includes a nail holder 502 or pin locator and a nail retainer 520 or securing cap. The nail retainer 520 includes a main body 522 with a center opening 524 and two snap-in latches 526 extending downwardly at the side of the main body 522. The nail holder 502 includes a main body 504, a latching collar 510, and a mounting barrel 512 with external splines 514. The main body 504 has a hole 506 accommodating the mounting shank of fixture nail 160 and a snap-in ring 508. The fixture nail 160 is installed through the center opening 524 in the nail retainer 520. The snap-in latches 526 of the nail retainer 520 engage the snap-in ring 508 to secure the nail retainer 520 to the nail holder 502. The mounting barrel 512 of the nail holder 502 is installed in the round well 316 of the keyed locking mount 310 and the snap-in latches 322 of the keyed locking mount 310 engage the latching collar 510 of the nail holder 502.

Figure 24:
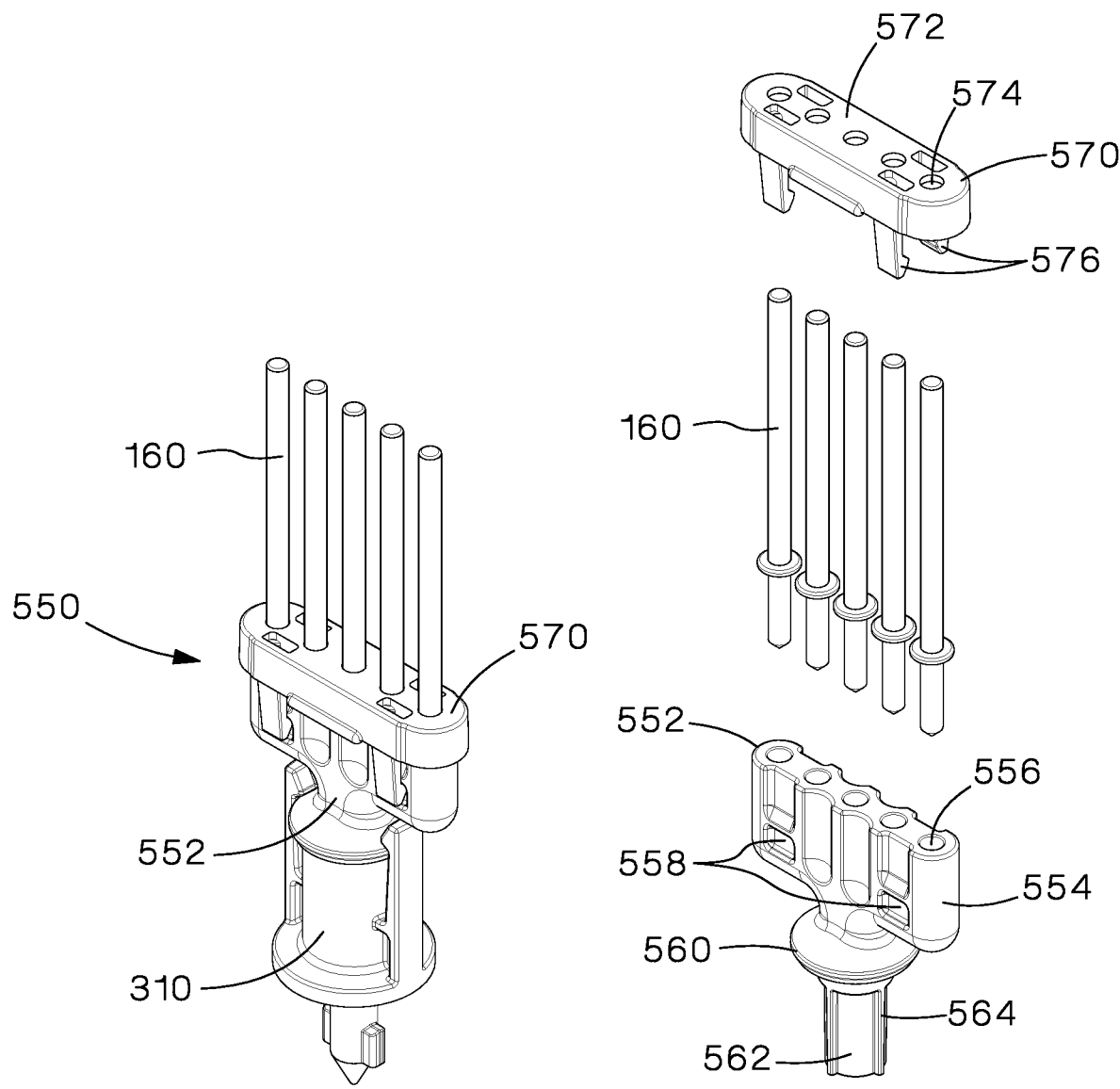
FIG. 24 is a top perspective view of a multiple nail holder assembly mounted to the keyed locking mount of FIG. 11.
Figure 25:
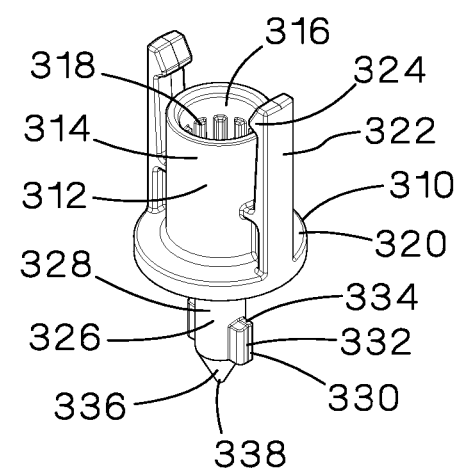
FIG. 25 is an exploded view of the multiple nail holder assembly of FIG. 24.
Figure 26:
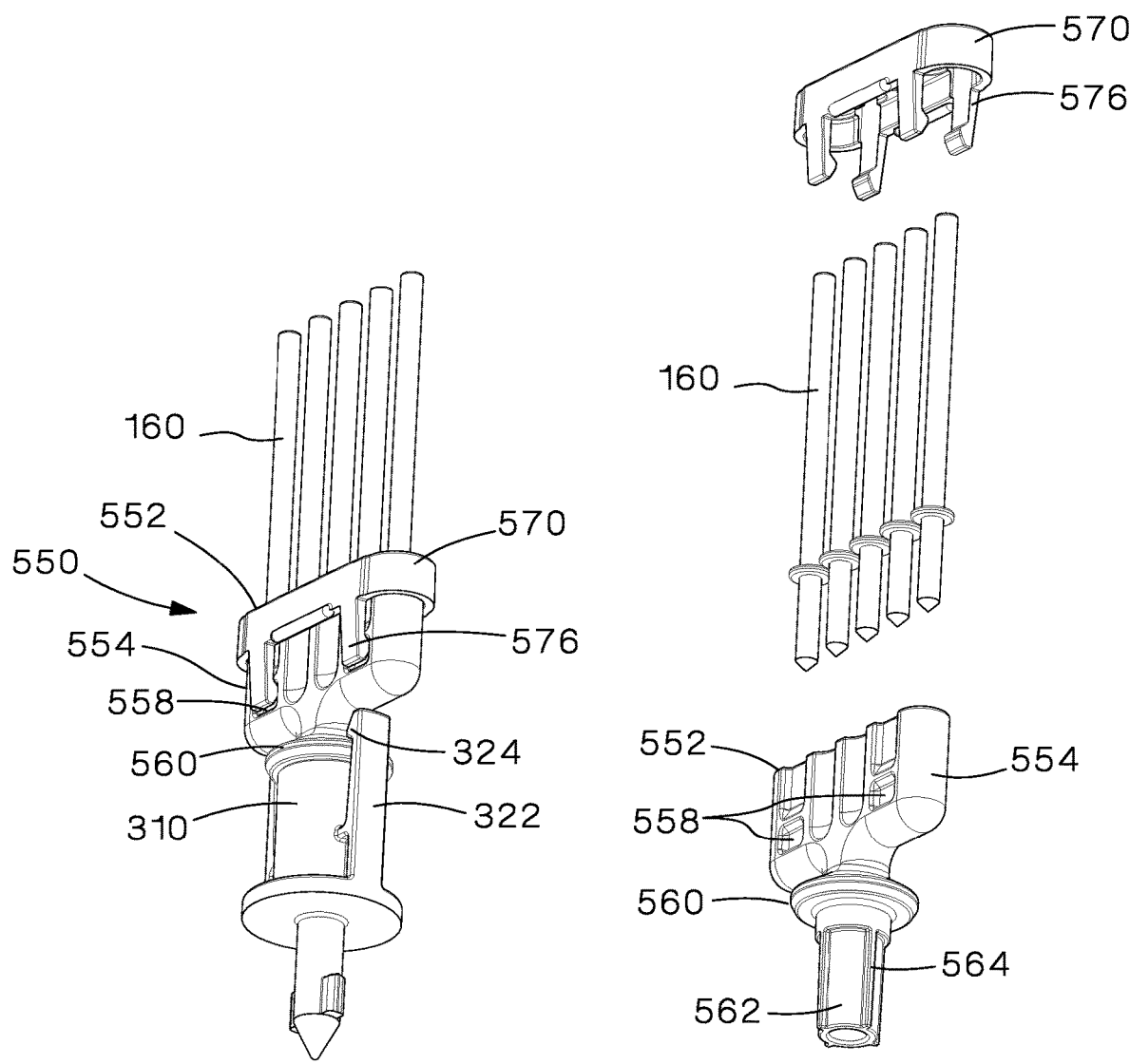
FIG. 26 is a bottom perspective view of the multiple nail holder assembly of FIG. 24.
Figure 27:
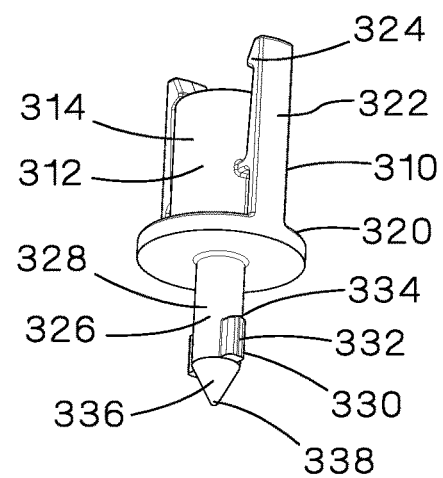
FIG. 27 is a bottom exploded view of the multiple nail holder assembly of FIG. 26.

The five nail holder assembly 550 includes a nail holder 552 or pin locator and a nail retainer 570 or securing cap for holding the nails or pins. The nail holder 552 includes a main body 554, a latching collar 560 and a mounting barrel 562 with external splines 564. The main body 554 includes five holes 556 for accommodate the mounting shank of nails 160 and snap-in pockets 558. The nail retainer 570 includes a main body 572 with five holes 574 and downwardly extending snap-in latches 576. As illustrated in FIGS. 24 and 26, the snap-in latches engage the snap-in pockets 558 of the nail holder main body 554. Although four snap-in latching mechanisms are illustrated, it is contemplated that the nail holders may only include two snap-in latching mechanisms. Additionally, the illustrated embodiment accommodates five nails where one nail is positioned at the center of the nail holder 552. The nail holder 552 can accommodate a combination of nails in any quantity up to five nails. As such, some of the nails in the fixture may be removed, when desired, to have wider spacing between the nails.

Figure 28:
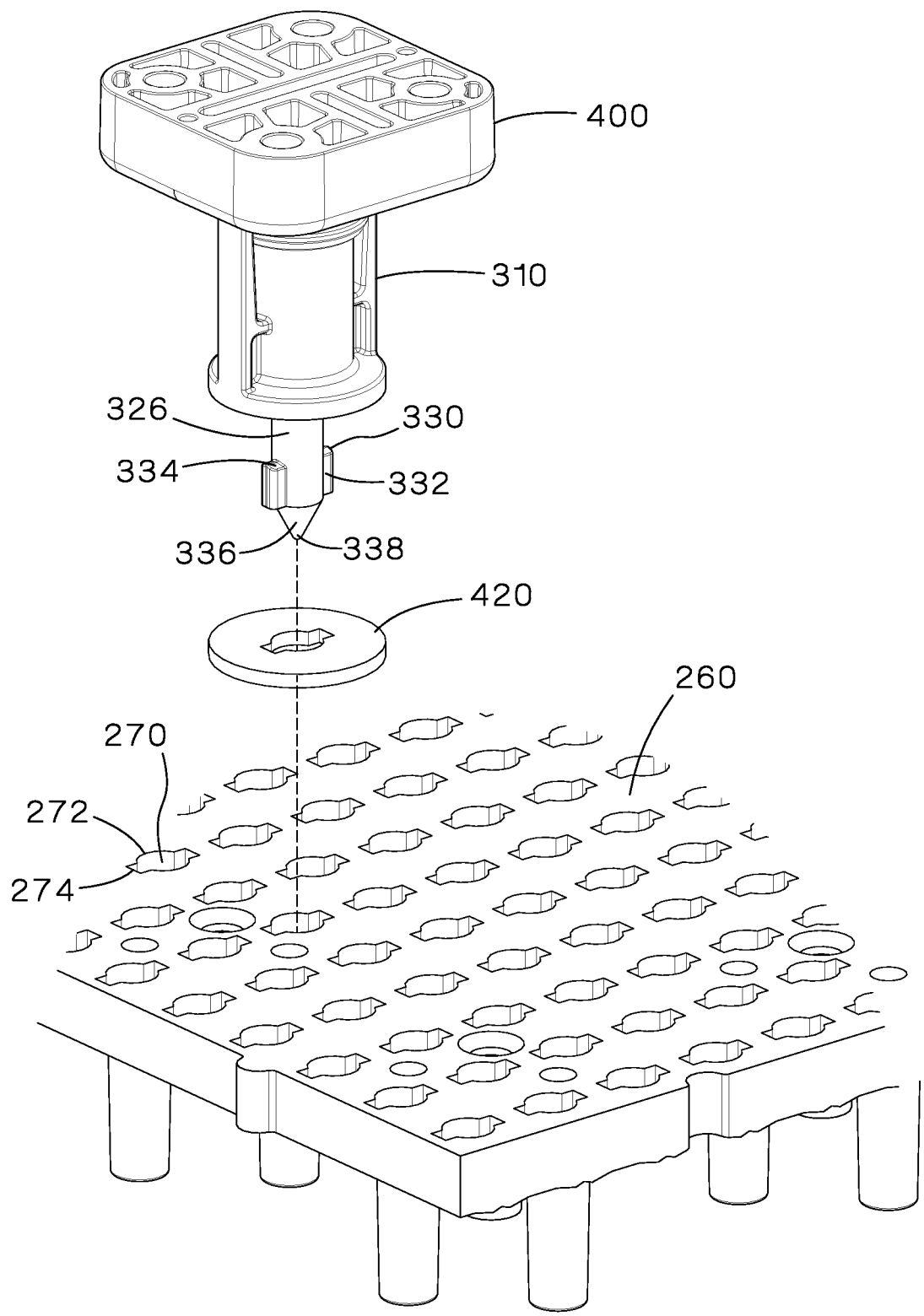
FIG. 28 is a partially exploded view of the wire harness assembly of FIG. 11 with the keyed locking mount and fixture mounting block positioned to be installed.
Figure 31:
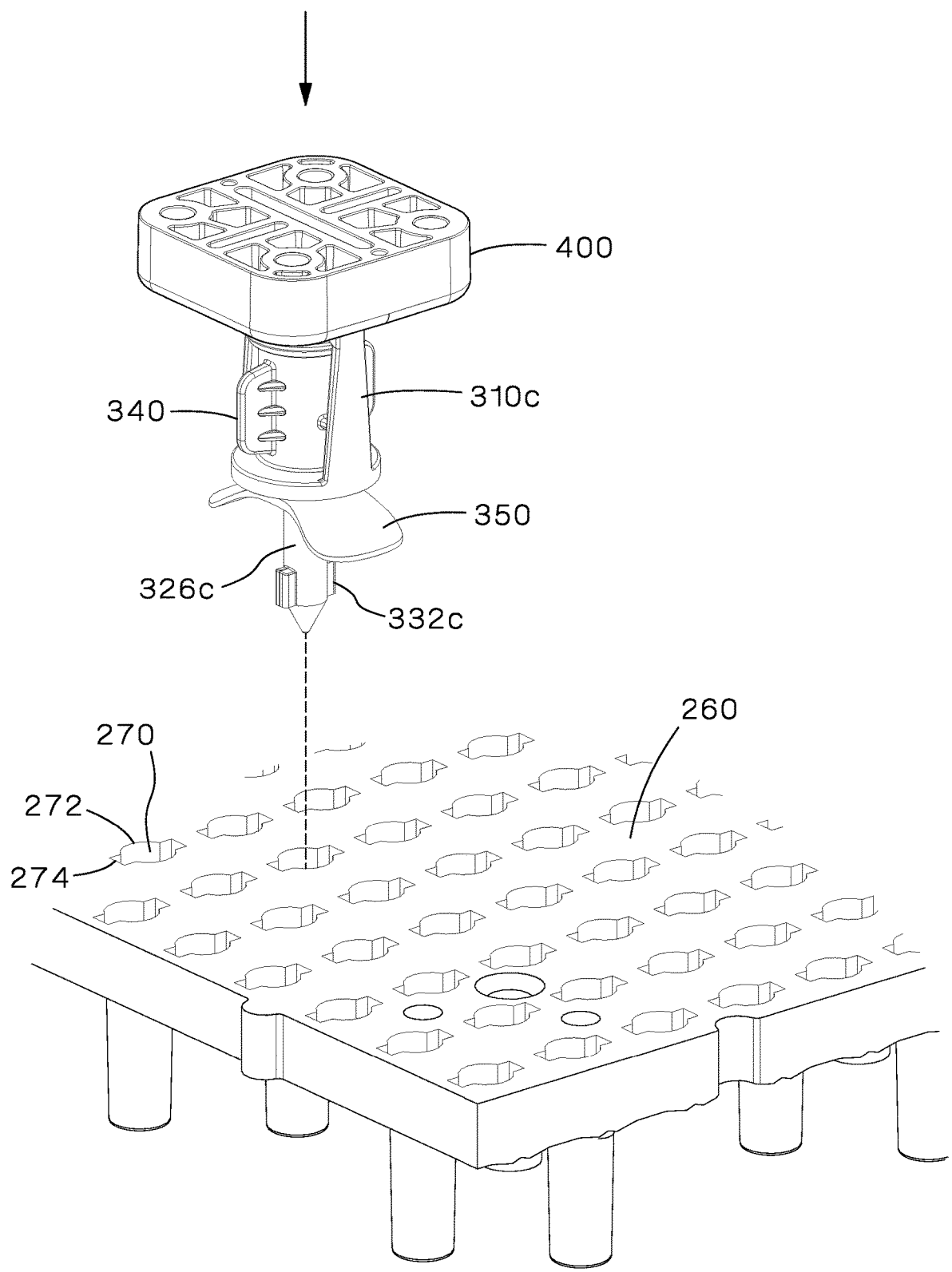
FIG. 31 is a partially exploded view of a tile of the wire harness assembly and an alternative keyed locking mount with the fixture mounting block positioned to be installed in the wire harness tile.
Figure 32:
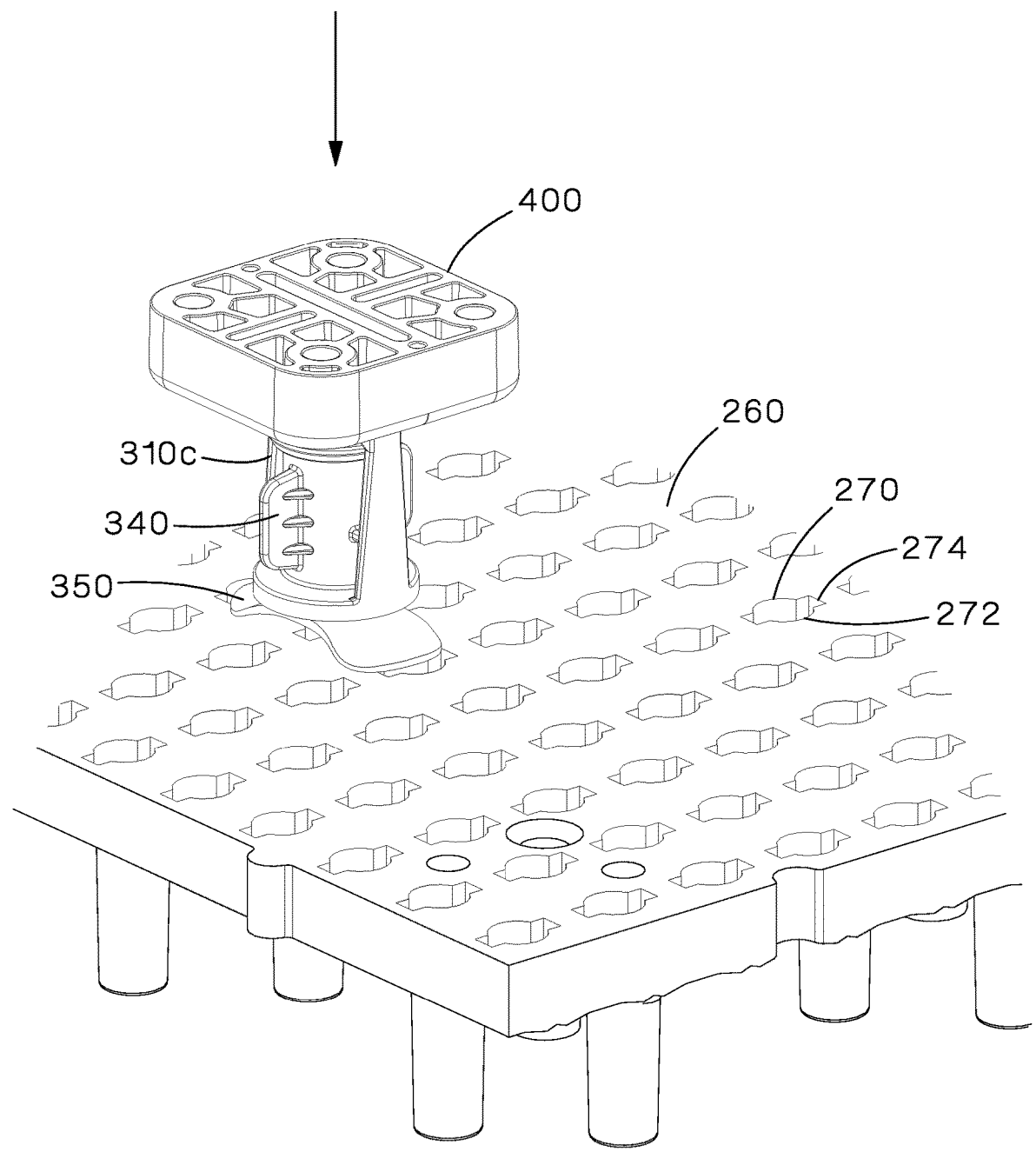
FIG. 32 is a perspective view of the wire harness assembly of FIG. 31 with the keyed locking mount inserted in the tile.
Figure 33:
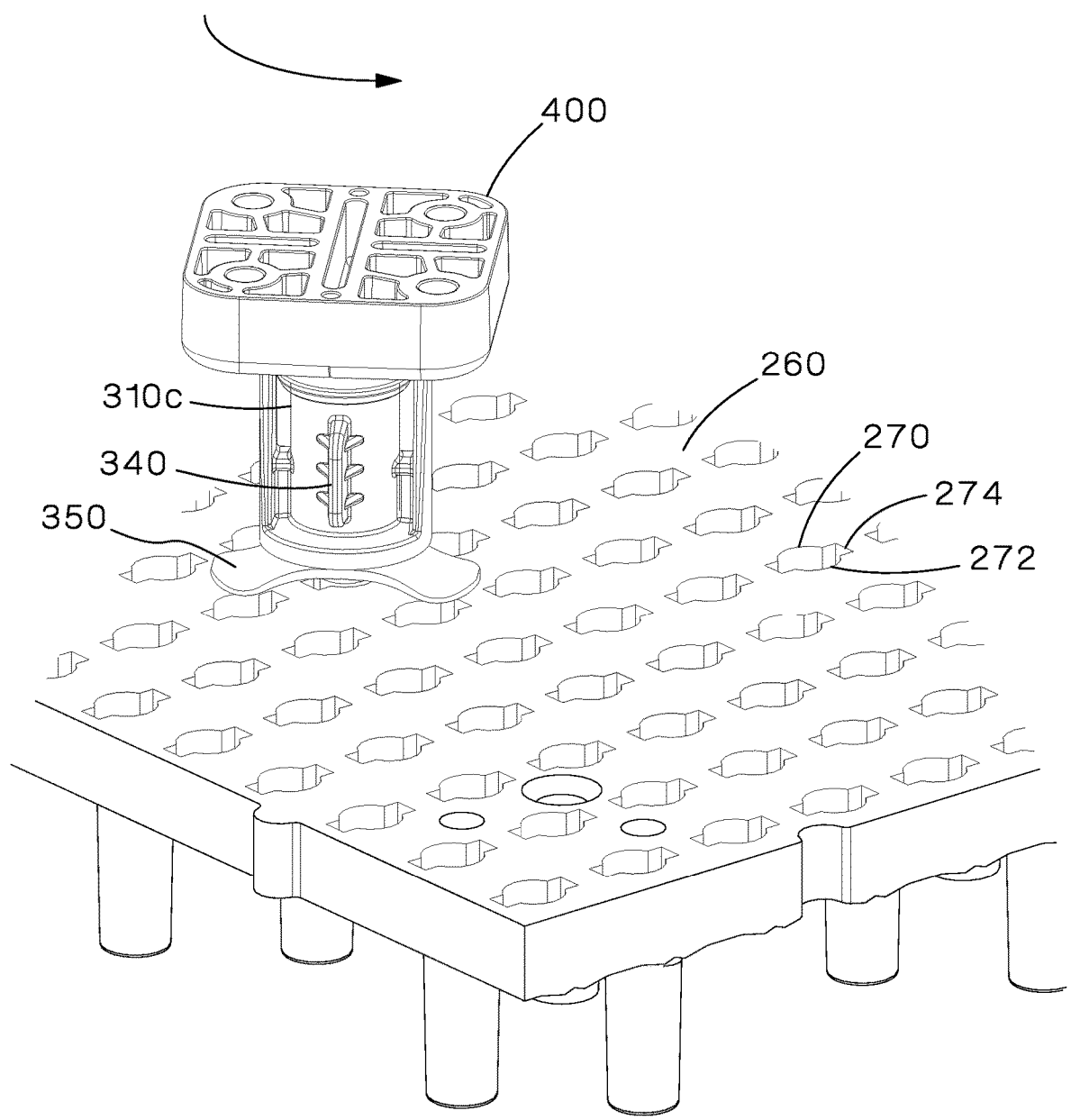
FIG. 33 is perspective view of the wire harness assembly of FIG. 31 with the keyed locking mount rotated to be partially installed in the tile.
Figure 34:
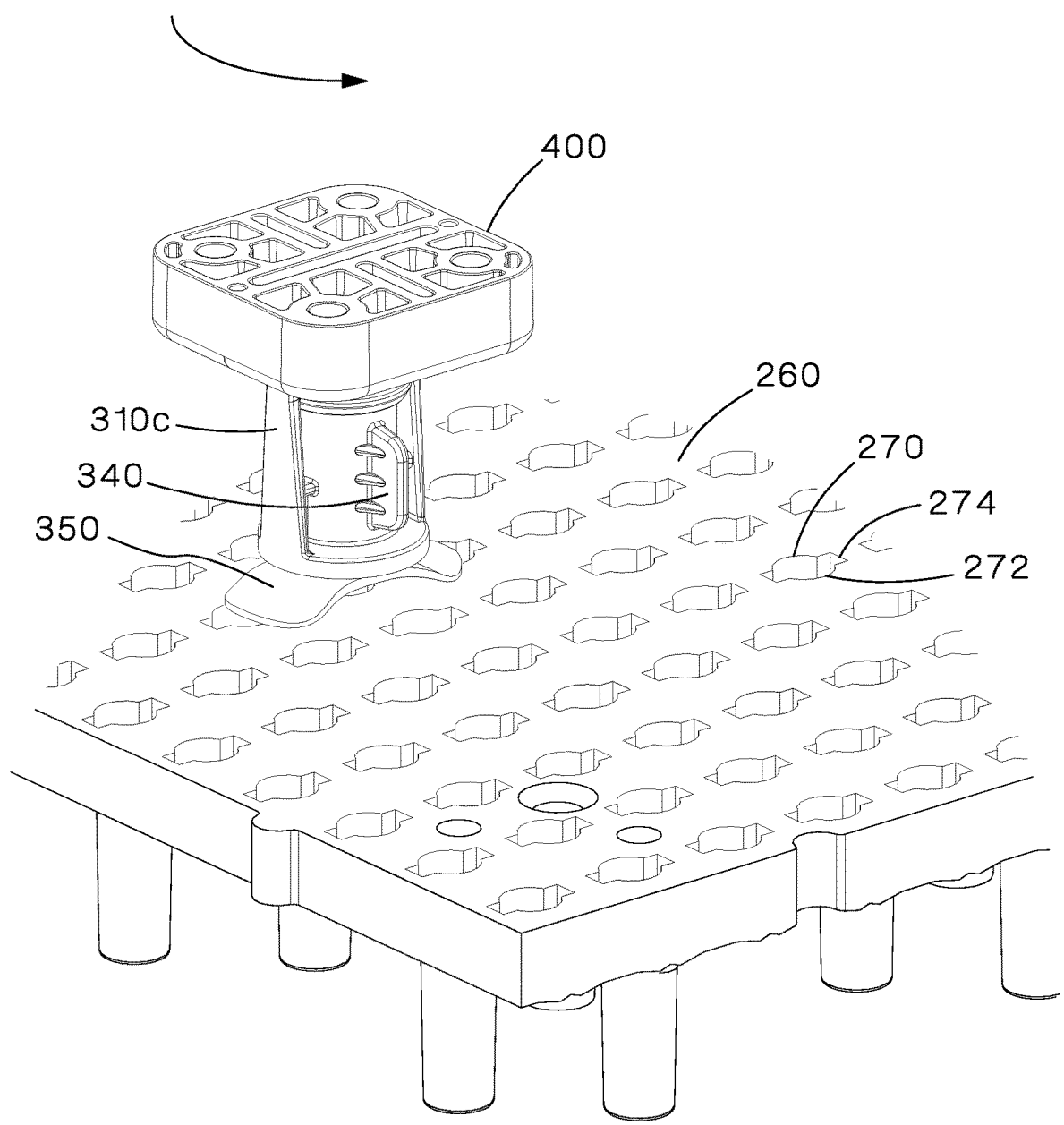
FIG. 34 is perspective view of the wire harness assembly of FIG. 31 with the keyed locking mount rotated to be fully installed in the tile.

As illustrated in FIG. 28, the keyed locking mount 310 with attached fixture mount block 400 is positioned to be installed and secured on a wire harness grid tile 260. As described above with respect to FIG. 4, a compressible washer 420 is installed under base flange 320 of the keyed locking mount 310. The compressible washer 420 enables the keyed locking mount 310 to be turned and locked while still being firmly held on the wire harness tile 260. The keyed locking mount 310 is positioned such that the projections 332 are aligned with the side rectangular portions 274 in the keyed holes 270 in the wire harness grid tile 260. The compressible washer 420 includes a plastic laminate to reduce friction between the washer 420, the grid tile 260, and the harness layout sheet, if present. The plastic laminate of the washer 420 prevents the layout sheet from tearing when the washer is installed. The keyed locking mount 310 is installed in the wire harness grid tile 260 with the lower portion 326 extending through one of the circular holes 272 and the rectangular side projections 332 extending through the side rectangular portions 274. As described above, once the keyed locking mount 310 is inserted into the wire harness grid tile 260, the user rotates the keyed locking mount 310 ninety degrees from an installation position to a locked position (see FIGS. 29 and 30). The keyed locking mount 310 compresses the washer 420 as it is rotated in the wire harness grid tile 260. Once the keyed locking mount 310 is locked in a groove 280 and released by the user, the washer 420 expands. FIGS. 29 and 30 illustrate the bottom of the wire harness grid tile 260 with the installed keyed locking mount 310. The rectangular side projection 332 of the lower portion 326 is positioned in the V-shaped groove 280 adjacent ramps 282 of the wire harness grid tile 260.

FIGS. 31-34 illustrate the installation of an alternative keyed locking mount 310c in the wire harness grid tile 260. The keyed locking mount 310c is a combination of the keyed locking mounts 310a and 310b illustrated and described in FIGS. 16-19. The keyed locking mount 310c includes wings 340 and the flexible flange 350. The keyed locking mount 310c is positioned such that the rectangular side projections 332c extending from the lower portion 326c are aligned with the side rectangular portions 274 in the keyed holes 270 in the wire harness grid tile 260. The keyed locking mount 310c is installed in the wire harness grid tile 260 with the lower portion 326c extending through one of the circular holes 272 and the rectangular side projections 332c extending through the side rectangular portions 274. Once the keyed locking mount 310c is inserted into the wire harness grid tile 260, the user rotates the keyed locking mount 310c ninety degrees from an installation position to a locked position. As the keyed locking mount 310c is inserted and rotated, the flexible flange 350 compresses and flattens. Once the keyed locking mount 310c is released by the user, the flexible flange 350 returns to its original position.

FIGS. 35-41 illustrate joiner plates or grid tile connectors designed to join adjacent wire harness grid tiles to form the wire harness assembly. The joiner plates or grid tile connectors enable the grid tiles to be assembled without a plywood backing and ensure accurate alignment of the wire harness assembly.

Figure 35:
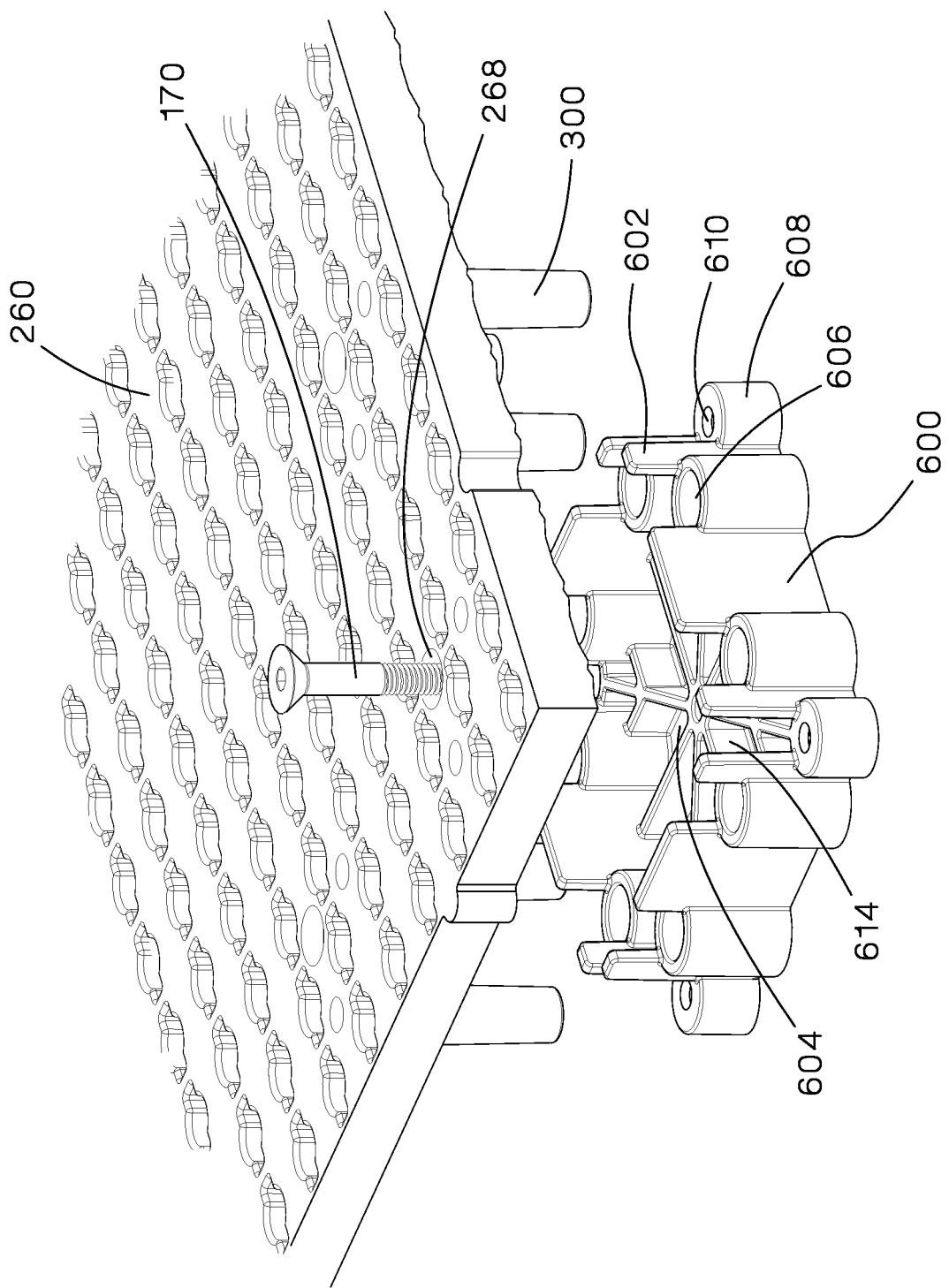
FIG. 35 is a top perspective view of a tile of the wire harness assembly positioned to be secured to a grid tile connector.
Figure 36:
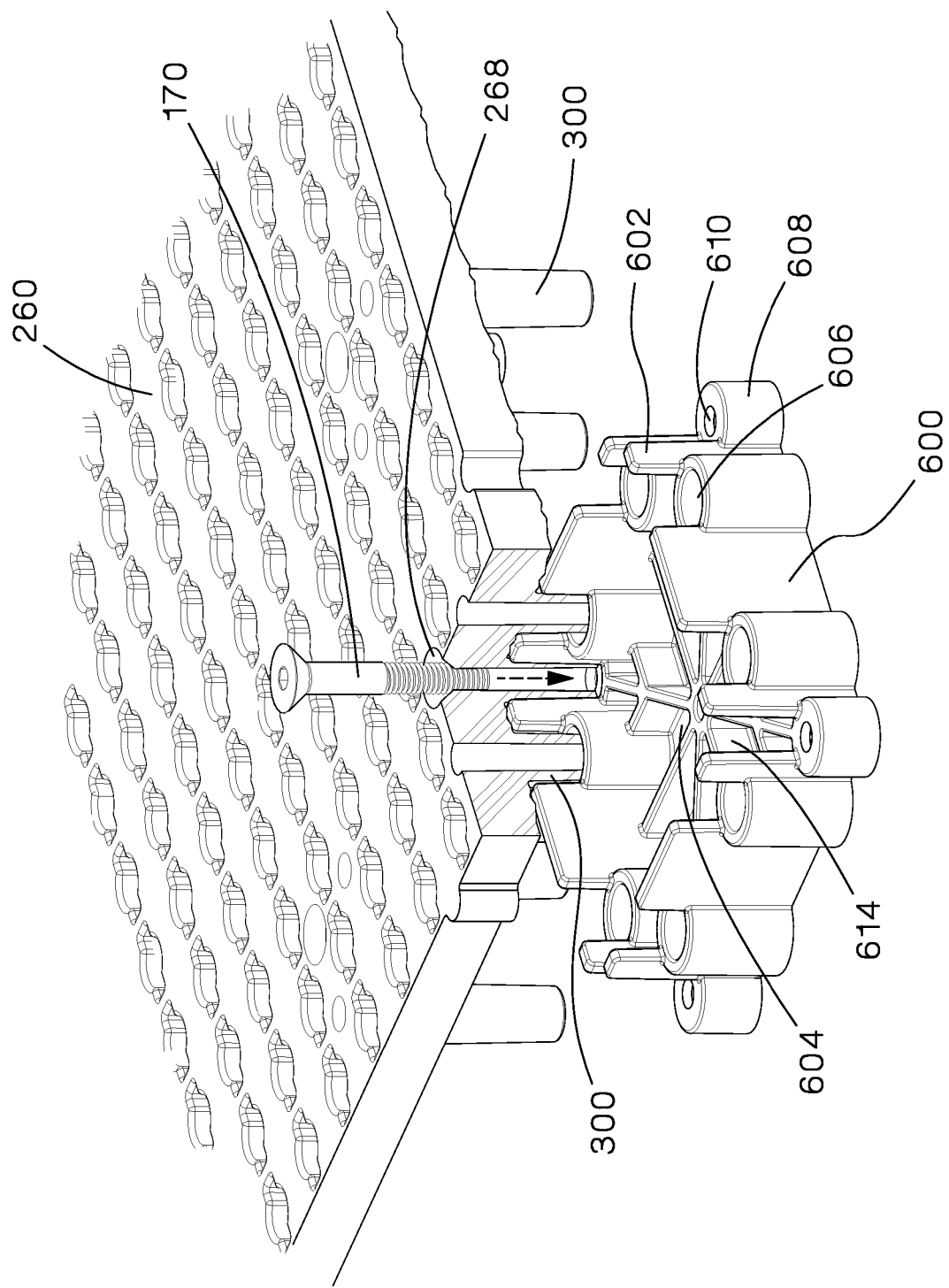
FIG. 36 is a top perspective view of the tile and grid tile connector of FIG. 35 with a section of the tile removed.
Figure 37:
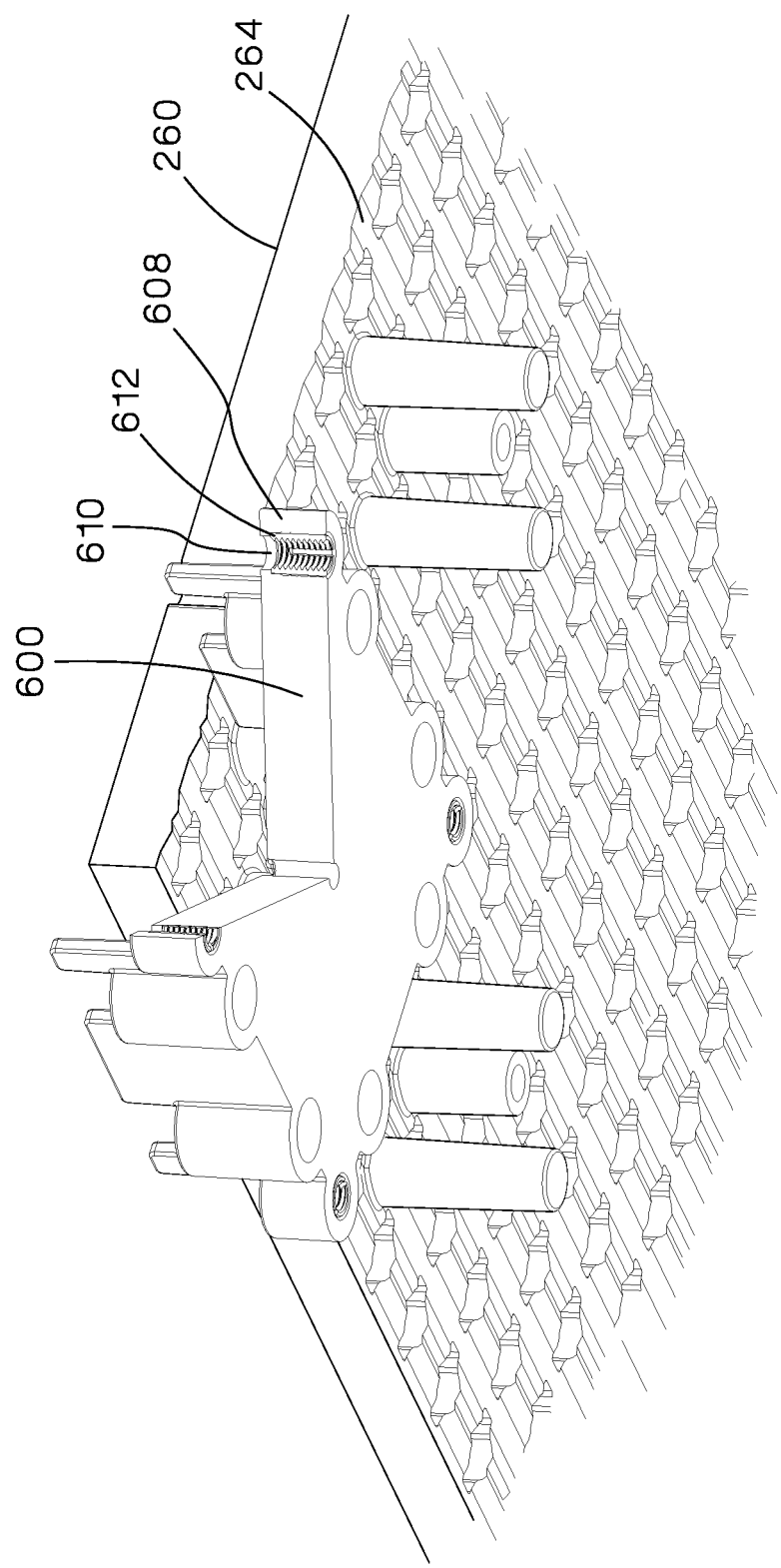
FIG. 37 is a bottom perspective view of the grid tile connector and wire harness tile of FIG. 35.

FIGS. 35-37 illustrate joiner plate or grid tile connector 600. The grid tile connector 600 includes elevated wall segments 602, a flat bottom 604, locating wells 606, corner posts 608, and reinforcing ribs 614. The corner posts 608 include counter bored holes 610 with threaded inserts 612 (see FIG. 37). The outer perimeter walls are elevated to reach the bottom 264 of the grid tile 260 for additional support. The legs 300 pass through the locating wells 606 and rest on the surface of which the wire harness grid tile 260 is set. The fit between the inner surfaces of the locating wells 606 and the outer surfaces of the legs 300 is relatively close thereby resulting in an improved rigidity for the wire harness tile assembly. The counter bored holes 610 with the threaded inserts 612 are aligned with the holes 268 in the harness board grid tile 260.

Figure 38:
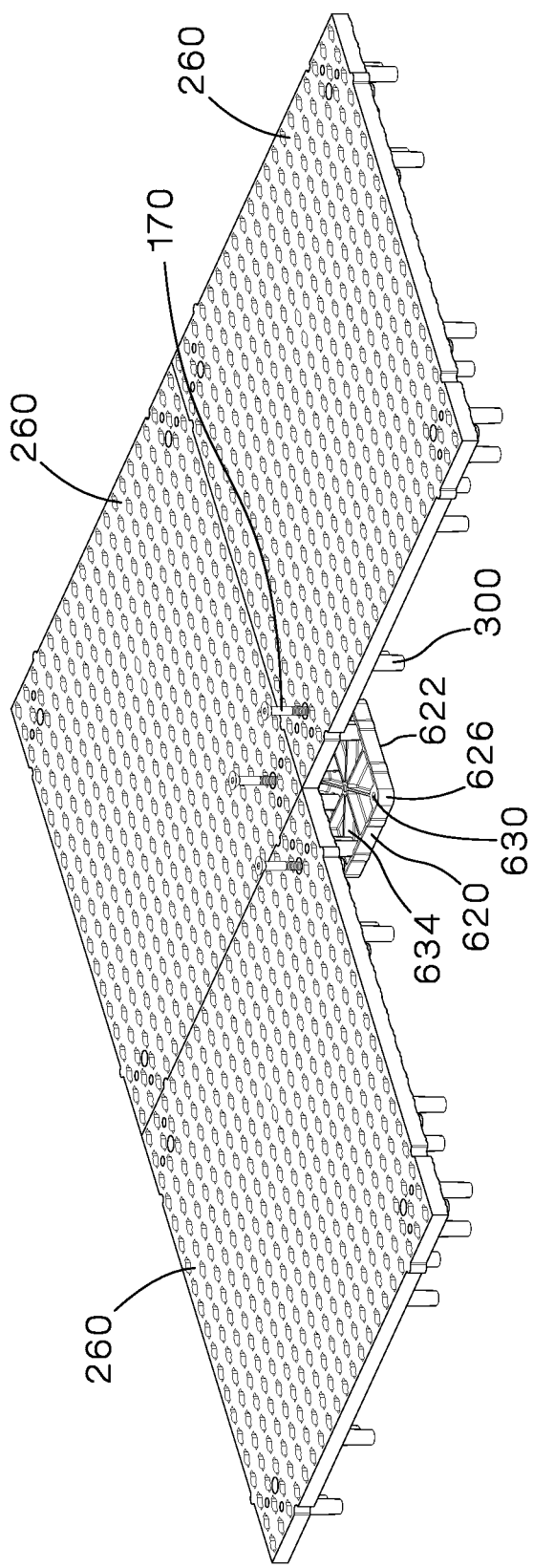
FIG. 38 is a perspective view of a plurality of tiles of the wire harness assembly joined by an alternative grid tile connector.

As illustrated in FIG. 38, an alternative embodiment of a joiner plate or grid tile connector 620 includes a flat bottom 622, corner posts 626 and reinforcing ribs 634. The flat bottom 622 has holes that accommodate the legs 300 of the wire harness grid tiles 260. The corner posts 626 have counter bored holes 630 with threaded inserts. The threaded inserts are pressed into the counter bore holes 630 from the underside so that they cannot be pulled out by fasteners 170 if they are overtightened.

Figure 39:
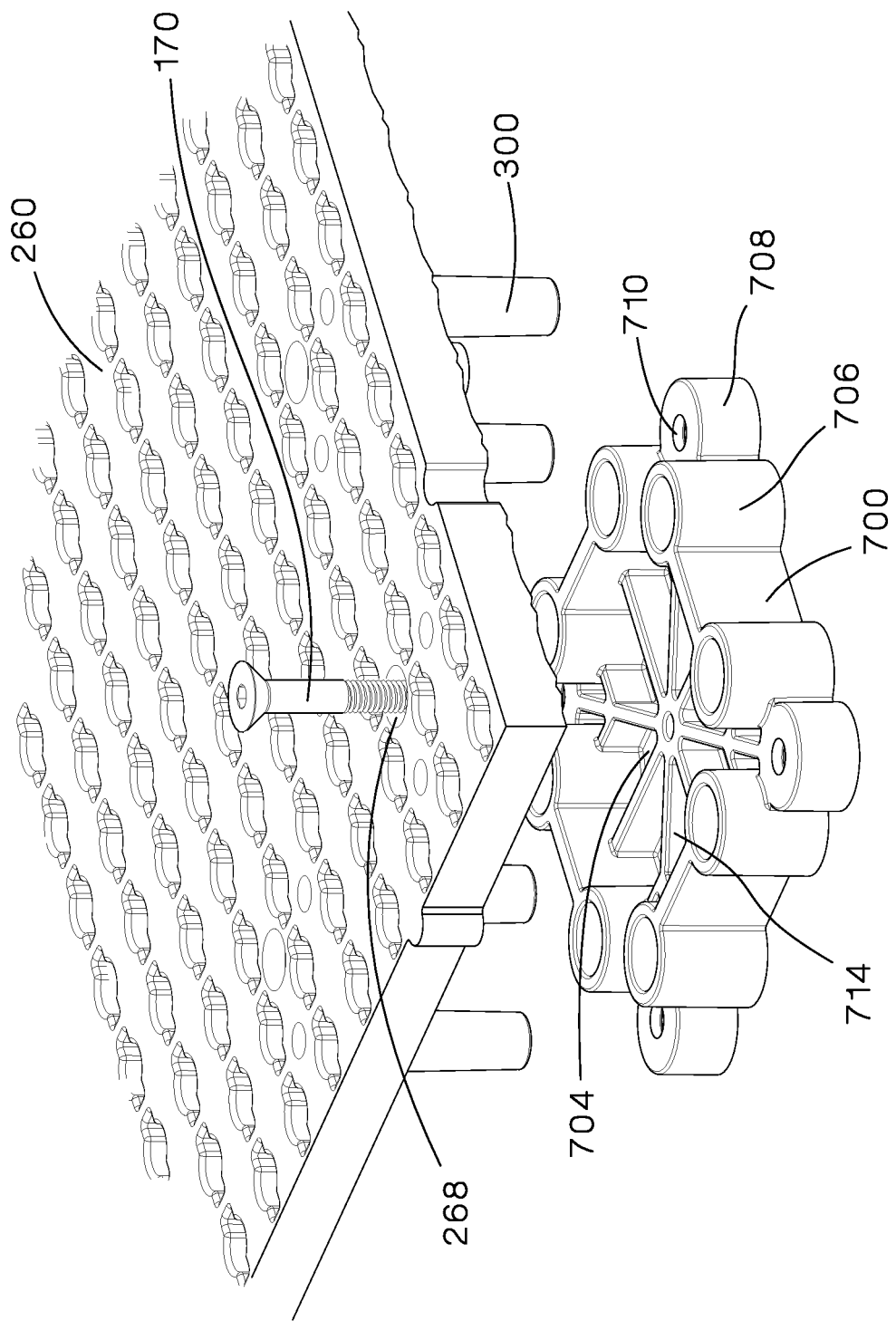
FIG. 39 is a top perspective view of a tile of the wire harness assembly positioned to be secured to an alternative grid tile connector.
Figure 40:
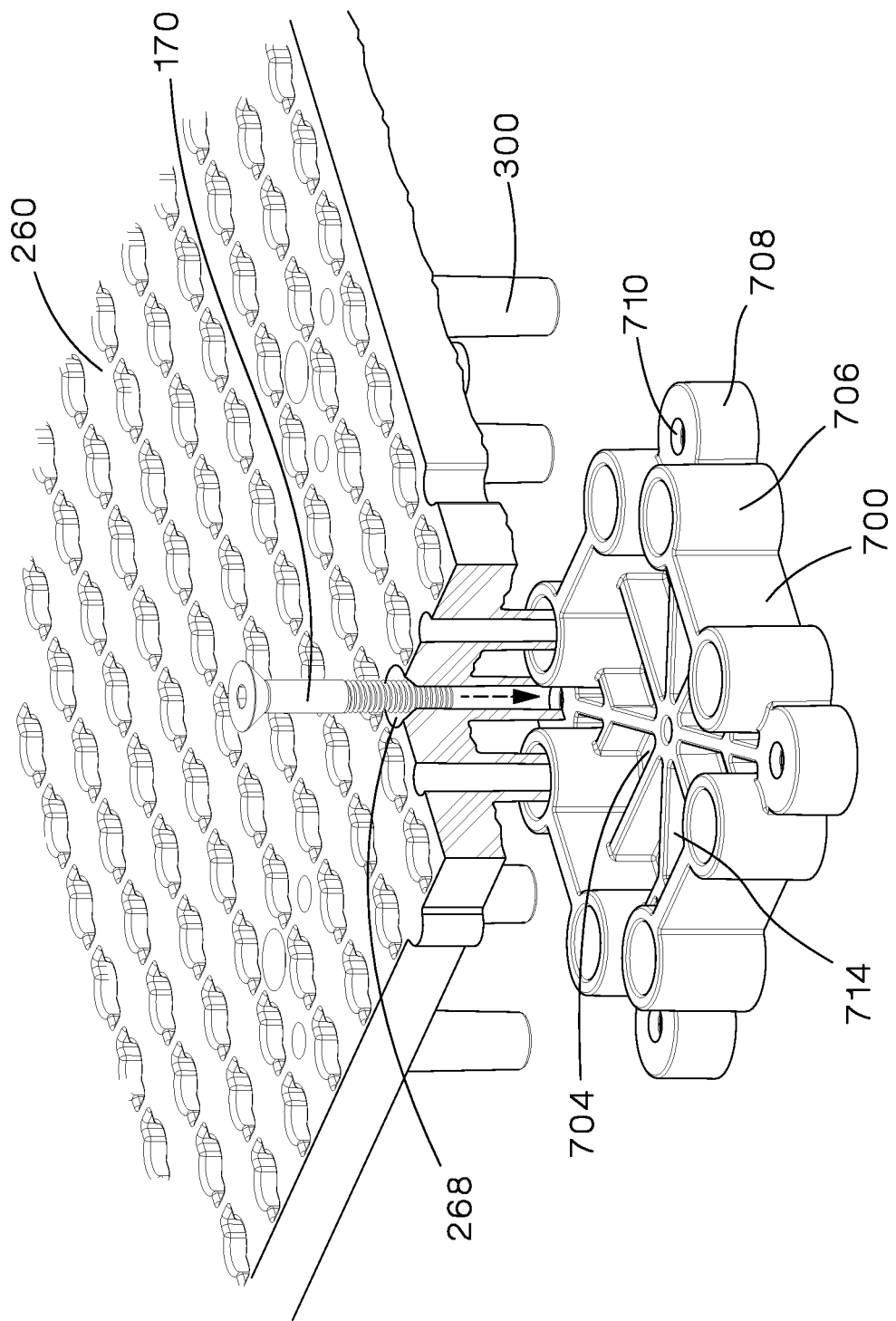
FIG. 40 is a top perspective view of the tile and grid tile connector of FIG. 39 with a section of the tile removed.
Figure 41:
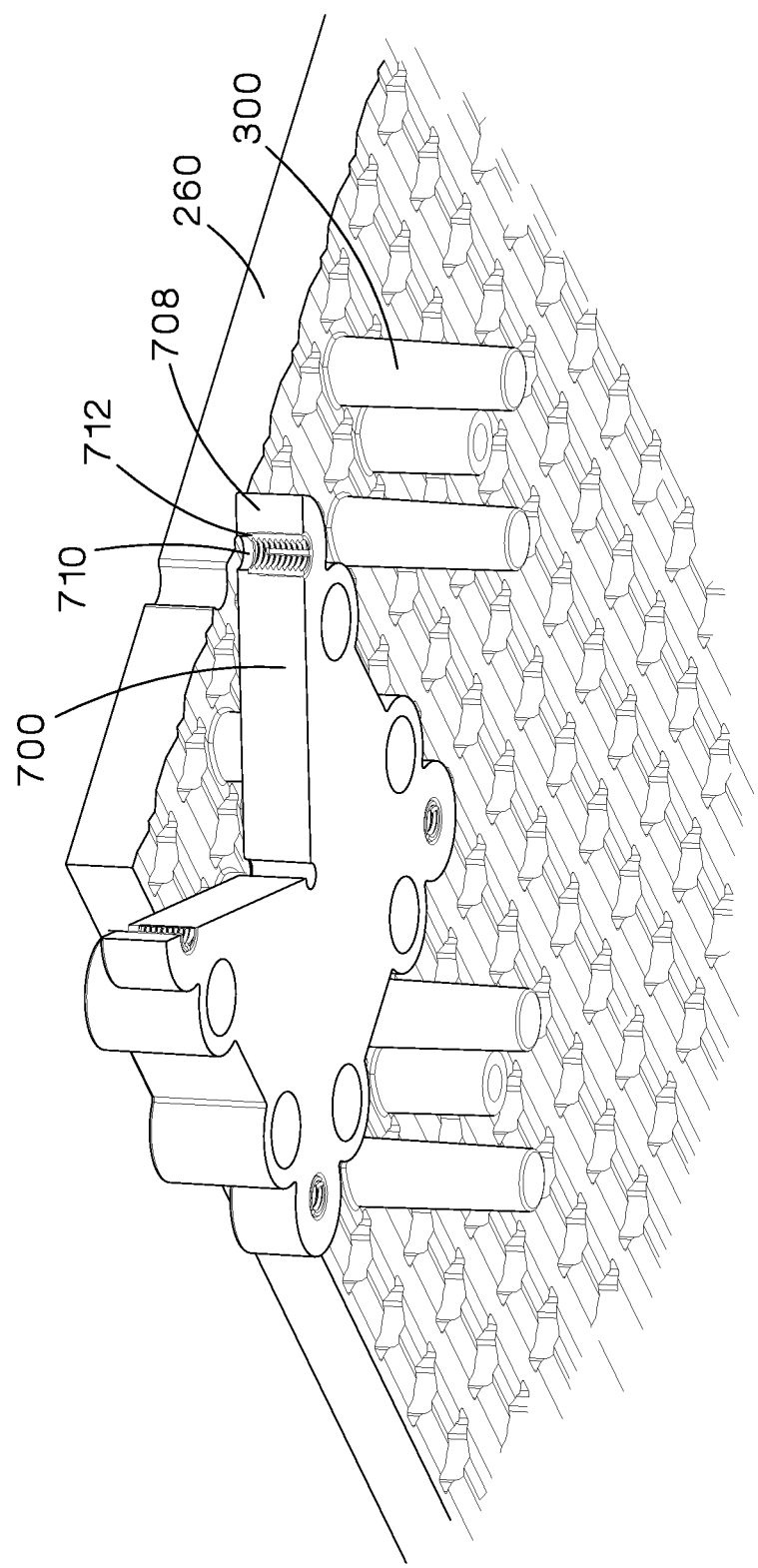
FIG. 41 is a bottom perspective view of the grid tile connector and wire harness tile of FIG. 39.

FIGS. 39-41 illustrate joiner plate or grid tile connector 700. The grid tile connector 700 includes a flat bottom 704, locating wells 706, corner posts 708, and reinforcing ribs 714. The corner posts 708 include counter bored holes 710 with threaded inserts 712 (see FIG. 41). The legs 300 pass through the locating wells 706 and rest on the surface of which the wire harness grid tile 260 is set. The fit between the inner surfaces of the locating wells 706 and the outer surfaces of the legs 300 is relatively close thereby resulting in an improved rigidity for the wire harness tile assembly. The counter bored holes 710 with the threaded inserts 712 are aligned with the holes 268 in the harness board grid tile 260.

Fasteners 170 are used to secure wire harness grid tiles 60, 260 to the grid tile connectors 600, 620, and 700. As many wire harness grid tiles 60, 260 may be used to form large wire harness assemblies of any size having dimensions equal to multiples of the individual wire harness grid tiles 60, 260. The grid tile connectors 600, 620, and 700 are used to fasten adjacent wire harness grid tiles together to ensure accurate alignment of the wire harness assembly system.

The wire harness assembly system described and illustrated herein is flexible and inexpensive. The wire harness grid tiles and the key locking mounts are easily assembled to form the wire harness assembly system required by the end user. The keyed locking mounts and various mounting fixtures are interchangeable and easily adjusted by the user, as desired. The keyed locking mounts and various mounting fixtures are made of a plastic material with the exception of the nails which may be made of steel or a plastic material.

Furthermore, while the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation. The actual scope of the invention is intended to be defined in the following claims when viewed in their proper perspective based on the prior art.

What is claimed is:

1. A wire harness assembly system comprising:
a grid tile comprising keyed holes extending through the grid tile;
a repositionable wire routing accessory to route wires along the grid tile, wherein the repositionable wire routing accessory is a mounting block having a top with a pattern of openings for receiving wire harness accessories, a bottom, and a latching collar;
a locking mount for receiving the repositionable wire routing accessory, wherein the locking mount having a main body with an upper portion, a base flange, and a lower portion; wherein the upper portion includes an opening, the repositionable wire routing accessory is installed within the opening, wherein the opening is a round well;
wherein the lower portion includes a locating shaft extending from the base flange, the locating shaft having keyed members positioned opposite each other; the keyed members corresponding to the keyed holes of the grid tile;
wherein the locking mount further comprising snap-in latches extending from the base flange, the snap-in latches are parallel to the upper portion and extend above the round well, the snap-in latches having a distal end with a hook;
wherein the hook of the snap-in latches of the locking mount engage the latching collar of the mounting block; and
wherein the locking mount is positioned in the keyed holes in the grid tile and rotated to a locked position in the grid tile to secure the repositionable wire routing accessory mounted thereto.

2. The wire harness assembly of claim 1, wherein the mounting block has a mounting barrel extending from a center of the bottom of the mounting block.

3. The wire harness assembly system of claim 2, wherein the round well has internal splines positioned equidistant from each other in the round well;
wherein the mounting barrel having a plurality of external splines positioned equidistant from adjacent splines; and
wherein the mounting barrel is positioned inside the round well with the external splines positioned adjacent to the internal splines in the round well;
whereby the internal splines and the external splines provide incremental angular positioning of the mounting block with respect to the locking mount.

4. The wire harness assembly system of claim 1, wherein the pattern of openings includes a plurality of parallel mounting slots with reinforcing ribs.

5. The wire harness assembly system of claim 1, wherein the top of the mounting block includes a rectangular pad with a pair of mounting holes.

* * * * *